US006760252B2

(12) United States Patent
Mikolajick

(10) Patent No.: US 6,760,252 B2
(45) Date of Patent: Jul. 6, 2004

(54) FLOATING GATE MEMORY CELL, METHOD FOR FABRICATING IT, AND SEMICONDUCTOR MEMORY DEVICE

(75) Inventor: Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 10/283,913

(22) Filed: Oct. 30, 2002

(65) Prior Publication Data

US 2003/0081457 A1 May 1, 2003

(30) Foreign Application Priority Data

Oct. 30, 2001 (DE) .......................................... 101 53 493

(51) Int. Cl.[7] ............................................. G11C 16/04
(52) U.S. Cl. ................. 365/185.01; 365/185.1
(58) Field of Search ......................... 365/185.01, 185.1

(56) References Cited

U.S. PATENT DOCUMENTS 6,157,061 A    12/2000  Kawata ...................... 257/316
6,621,734 B2 *  9/2003  Hamaguchi et al. ... 365/185.09

\* cited by examiner

*Primary Examiner*—Michael S. Lebentritt
*Assistant Examiner*—Pho M. Luu
(74) *Attorney, Agent, or Firm*—Laurence A. Greenberg; Werner H. Stemer; Gregory L. Mayback

(57) ABSTRACT

For particularly flexible and space-saving information storage, in the case of a floating gate memory cell and a corresponding semiconductor memory device, the invention includes providing a floating gate configuration with a plurality of floating gates. Each of the floating gates is configured for substantially independent information storage. As a result, a plurality of information units can be stored independently of one another in the memory cell.

85 Claims, 15 Drawing Sheets

FLOATING GATE MEMORY CELL, METHOD FOR FABRICATING IT, AND SEMICONDUCTOR MEMORY DEVICE

BACKGROUND OF THE INVENTION

Field of the Invention

The invention relates to a floating gate memory cell for nonvolatile information storage, a semiconductor memory device having a plurality of memory cells for nonvolatile information storage, and a method for fabricating a floating gate memory cell for nonvolatile information storage.

In the further development of semiconductor memory devices based upon nonvolatile memory mechanisms, the principle of the so-called nonvolatile floating gate memory cell has also been developed. Such a floating gate memory cell for nonvolatile information storage has a floating gate configuration, a source/drain configuration, and a control gate configuration. The floating gate configuration serves for the actual information storage, while the source/drain configuration is configured for access to the floating gate configuration and, thus, for access to the respective information. The control gate configuration is configured for controlling such access to the floating gate configuration and to the information.

What is disadvantageous in the case of existing semiconductor memory devices, memory cells contained therein, and corresponding fabrication methods for semiconductor memory devices or memory cells is that their fundamental concept, from a structural and production engineering standpoint, is based on the provision of a single binary information unit in each individual memory cell. Each memory cell and, thus, each memory location are, thus, occupied only singularly with information and configured accordingly.

SUMMARY OF THE INVENTION

It is accordingly an object of the invention to provide a floating gate memory cell, method for fabricating it and semiconductor memory device that overcome the hereinafore-mentioned disadvantages of the heretofore-known devices and methods of this general type and that, in a particularly simple manner, obtains a particularly high information density and, in a particularly reliable manner, modifies and retrieves such information.

With the foregoing and other objects in view, there is provided, in accordance with the invention, a floating gate memory cell for nonvolatile storage of information including at least one of information units and binary bits, including a floating gate configuration for storing the information, the floating gate configuration having floating gates each independently storing the information and, as a result, storing a corresponding plurality of one of the information units and the binary bits independently of one another in the memory cell, a source/drain configuration accessing the floating gate configuration, a control gate configuration controlling access to the floating gate configuration, the control gate configuration having control gates each associated with a respective one of the floating gates, access to the respective one of the floating gates being controlled by each respective one of the control gates, and the source/drain configuration having two source/drain regions jointly provided for the floating gates and the control gates to permit access of all of the floating gates through the two common source/drain regions.

The invention's floating gate memory cell for nonvolatile information storage is characterized in that the floating gate configuration has a plurality of floating gates, in that each of the floating gates is configured for substantially independent information storage, and in that, as a result a corresponding plurality of information units, in particular, binary bits, can be stored independently in the memory cell.

Thus, in contrast to the prior art, the invention departs from the one-bit concept and, consequently, the floating gate memory cell according to the invention is configured for storing a plurality of information units, in particular, binary bits or the like. Such a characteristic is realized by virtue of the fact that, in contrast to the floating gate memory cell according to the prior art, the floating gate configuration is configured with a plurality of floating gates. In such a case, each of the floating gates is configured for separate and independent information storage independently of the other floating gates. Consequently, by way of example, a respective bit can be written and retrieved, in accordance with an impressed potential state, in each of the floating gates.

Each floating gate can also be configured for taking up more than two charge and/or potential states, thereby, further increasing the information density per floating gate memory cell.

The structure of the floating gate memory cell according to the invention is configured particularly flexibly if, in accordance with another feature of the invention, the control gate configuration has a plurality of control gates, a respective control gate is assigned to a respective floating gate and the access to the assigned floating gate and the information state contained therein is controllable by each control gate. The initially organizational assignment of a respective control gate of the control gate configuration with a respective floating gate of the floating gate configuration results in a particularly flexible control of the access to the information to be stored in the floating gate. The initially organizational and sequence-technical assignment between floating gate and control gate will, advantageously, also be represented in a structural or spatial assignment, in particular, in a particular spatial proximity of the assigned floating gates and control gates with respect to one another.

A further simplification of the floating gate memory cell according to the invention results if the source/drain configuration has two source/drain regions, the source/drain regions are provided jointly for the plurality of floating gates and/or for the plurality of control gates, and all the floating gates can be accessed by the two common source/drain regions.

With regard to a particularly simple fabrication procedure and also with regard to a corresponding functional reliability, the floating gates are configured substantially identically with regard to their geometrical and/or material properties.

For the reliability of the floating gate memory cell according to the invention, on the other hand, the floating gates are disposed and configured in a manner substantially electrically insulated from one another, from the control gates and from the source/drain regions, and in that, in particular, each floating gate in the floating gate memory cell is configured and disposed in a substantially capacitively coupled manner.

Furthermore, it is advantageous that the floating gates are configured substantially identically with regard to their geometrical and/or material properties.

It is further preferred that the control gates are disposed and configured in a manner substantially electrically insulated from one another, from the floating gates, and from the source/drain regions.

In accordance with a further feature of the invention, the floating gates and/or the control gates are composed of a polysilicon material, polycide, metal, and/or the like.

In accordance with an added feature of the invention, the floating gates and the control gates are composed substantially of the same material.

To realize the assignment between the floating gates and the control gates, in accordance with an additional feature of the invention, the mutually assigned floating gates and control gates are in each case configured in direct spatial proximity to one another, and that, in particular, respective intermediate insulation regions are provided in such a case, in particular, in each case an intermediate dielectric between the respectively assigned floating gates and the control gate.

The intermediate dielectric is also referred to as interpoly dielectric and may be, e.g., an NO or ONO structure, i.e., a structure with a configuration including nitride/oxide or oxide/nitride/oxide, respectively.

It is, furthermore, preferred that each floating gate has a first end region and a second end region. The respective first end region is configured and disposed in direct spatial proximity to the first source/drain region and the respective second end region is configured and disposed in direct spatial proximity to the second source/drain region. As a result, in particular, a spatial and/or areal overlap is formed between the floating gates, in particular, between the respective end regions thereof, and the source/drain regions.

In accordance with yet another feature of the invention, there is provided an insulation region, in particular, in the form of a silicon dioxide material, is provided between the respective floating gate, in particular, the end regions thereof and the source/drain regions.

In accordance with yet a further feature of the invention, a main region of the floating gate cell is formed, to be precise as an elevated region, in particular, as a lamella, a web, a burr, or the like, of a semiconductor material region.

In such a case, the main region, in particular, the lamella, advantageously has side regions. Furthermore, in such a case the, in particular, two, floating gates are provided in the region of the side regions, in particular, in a manner lying opposite one another with the main region in between, in particular, in direct spatial proximity thereto with provision in each case of an insulation region toward the main region.

The provision of such a lamellar region with side regions results practically automatically in an electrical insulation and spatial separation between the floating gates to be formed, on one hand, and between the control gates to be formed, on the other hand.

In accordance with yet an added feature of the invention, the source/drain regions are configured as—in particular $n^+$-doped—regions of the main region, isolated, in particular, by a channel region as part of the main region. Although n-channel transistors are preferred, p-channel transistors are, nevertheless, possible and provided. In such a case, source/drain regions are, then, configured to be $p^+$-doped.

Such a procedure with the configuration as lamella, thus, additionally automatically enables the formation of source/drain regions that are spatially separate from one another and substantially electrically insulated from one another.

Furthermore, by virtue of its linear extent and by virtue of the possibility of disposing a plurality of such lamellae parallel to one another, the lamellar structure enables a particularly simple procedure when configuring a semiconductor memory device with a plurality or multiplicity of floating gate memory cells according to the invention.

Thus, in the case of the invention's semiconductor memory device having a plurality of memory cells for nonvolatile information storage, the memory cells are configured as floating gate memory cells according to the invention.

In accordance with yet an additional feature of the invention, adjacent memory cells use at least some of the control gates as common control gates.

In accordance with again another feature of the invention, the plurality of memory cells is configured and disposed in a matrix-like manner and on a plurality of substantially identical main regions, in particular, in the form of lamellae, webs, burrs, or the like.

The design and structure of the semiconductor memory device according to the invention is configured particularly advantageously if the main regions are configured and disposed in a manner extending linearly and substantially equidistantly with respect to one another.

In such a case, the main regions, in particular, the lamellae, are provided substantially as columns and/or as rows of the matrix-like configuration of memory cells.

The invention's method for fabricating a floating gate memory cell for nonvolatile information storage is presented below. A fabrication method of the generic type is used as a basis in this case. In the case of the method of the generic type, a floating gate configuration, a source/drain configuration, and a control gate configuration are provided. The floating gate configuration is configured for the actual information storage. The source/drain configuration is configured for access to the floating gate configuration. The control gate configuration is configured for controlling the access to the floating gate configuration and to the information contained therein.

With the objects of the invention in view, there is also provided a method for fabricating a floating gate memory cell for nonvolatile information storage, including the steps of providing a floating gate configuration for storing information, the floating gate configuration having floating gates each storing the information substantially independently of one another in the memory cell, accessing the floating gate configuration with a source/drain configuration, controlling the access to the floating gate configuration with a control gate configuration having a plurality of control gates, a respective one of the control gates being associated with a respective one of the floating gates, controlling access to the associated one of the floating gates with each respective one of the control gates, providing the source/drain configuration with two source/drain regions jointly associated with the floating gates and the control gates, and making accessible all of the floating gates through the two common source/drain regions.

The invention's method for fabricating a floating gate memory cell is characterized by configuring the floating gate configuration with a plurality of floating gates, each of the floating gates being configured for substantially independent information storage, and, as a result, a corresponding plurality of information units, in particular, binary bits or the like, can be stored independently of one another in the memory cell.

In accordance with again a further mode of the invention, the control gate configuration is provided having a plurality of control gates, a respective control gate is assigned to a respective floating gate, and the access to the assigned floating gate is configured to be controllable by each control gate.

On the other hand, the source/drain configuration is provided having two source/drain regions, the source/drain regions are provided jointly for the plurality of floating gates and/or for the plurality of control gates, and, as a result, all the floating gates are accessible through the two common source/drain regions.

In accordance with again an added mode of the invention, in each case the floating gates and/or in each case the control gates are configured substantially identically with regard to their geometrical and/or material properties.

It is, furthermore, preferred for the floating gates and/or the control gates to be disposed and configured in a manner substantially electrically insulated from one another from the control gates and/or from the floating gates and from the source/drain regions.

In the case of the floating gates, it is, furthermore, preferred that they are configured and disposed in a substantially capacitively coupled manner in the floating gate memory cell by virtue of these measures.

The floating gates and/or the control gates are preferably formed from a polysilicon material, polycide, metal, and/or the like. In particular, they are formed from the same material.

It is advantageous to configure the control gate in each case with low impedance. By contrast, the floating gates can also have high impedance.

To realize the assignment between the respective floating gates and the respective control gates, the floating gates and control gates that are respectively assigned to one another are provided in direct spatial proximity to one another, and, in such a case, in particular, an intermediate insulation region, in particular, an intermediate dielectric is provided in each case.

Preferably, each floating gate is configured with a first end region and a second end region. The respective first end region is configured and disposed in direct spatial proximity to the first source/drain region and the respective second end region is configured and disposed in direct spatial proximity to the second source/drain region. As a result, in particular, a spatial or areal overlap is formed between the floating gates, in particular, between the respective end regions thereof, and the source/drain regions. Preferably, an insulation region, in particular, in the form of a silicon dioxide material, is, furthermore, formed between the respective floating gates, in particular, the end regions thereof, and the respective source/drain region.

It is particularly preferred that in each case an elevated region, in particular, a lamella, a web, a burr, or the like of a semiconductor material region is formed as main region of the floating gate cell. In such a case, the main region, in particular, the lamella or the like, is formed with side regions. Furthermore, floating gates—in particular two—are provided in the region of the side regions, in particular, in a manner lying opposite one another with the main region in between, in particular, in direct spatial proximity thereto with provision in each case of an insulation region toward the main region.

It is particularly advantageous that the source/drain regions are configured as in particular, $n^+$-doped or $p^+$-doped—regions of the main region, isolated, in particular, by a channel region as part of the main region.

The previous characterizing features of the fabrication method according to the invention represent, in part, the structural features of the floating gate memory cell to be formed according to the invention. However, different configurations are, furthermore, conceivable during the fabrication.

In accordance with again an additional mode of the invention, first, a semiconductor substrate region, in particular, in the form of p-doped silicon, is provided. Local doping regions, in particular, in $n^+$-doped form, are, then, formed for the source/drain regions to be formed, in particular, by implantation. Afterward, the main region for the memory cell is, then, formed by etching back the surroundings in the semiconductor material region, in particular, using a masking process or the like.

It is also possible to use n-doped silicon, in which case $p^+$-doped source/drain regions are to be provided.

The last two steps mentioned can also be carried out with their order reversed so that, first, the main regions, that is to say, in particular, the lamellar structure, is formed by etching back the surroundings in the semiconductor material region, in particular, using a masking process or the like, and, then, doping regions in local form are formed subsequently, in particular, by implantation.

Advantageously, the local doping regions are formed in a first strip form, and the etching back is effected in a second strip form, transversely with respect to the first strip form.

Particularly advantageous structures result if, in accordance with still another mode of the invention, the main region is configured to be linear and/or approximately parallelepipedal. Such a configuration can be effected by skillful process control during etching back.

Then, an insulation layer is formed or deposited substantially conformally, in particular, made of a silicon dioxide material and/or, in particular, for the insulation region between the main region and the floating gates to be formed.

Furthermore, the insulation layer is formed by being grown.

Afterward, a material region is, then, formed, in particular, deposited, for the floating gates to be formed. In such a case, in particular, polysilicon material or the like is used.

Afterward, the floating gates are, then, patterned, in particular, by etching columns into the material region for the floating gates. In such a case, the columns are formed such that they run perpendicularly to the direction of extent of the main region, that is to say, for example, of the lamella. Such a formation is followed by removal or etching back of the material region for the floating gates to a point below the level of a surface region of the main region, for example, of the lamella so that the material region or the material for the floating gates remains only in the region of the side regions of the main region.

Afterward, a material region is formed or deposited substantially over the whole area and/or conformally, in particular, for the intermediate insulation region to be formed between assigned floating gates and control gates.

Afterward, a material region is formed or deposited substantially over the whole area and/or conformally, in particular, for the control gates to be formed.

Afterward, the control gates are patterned, in particular, by etching columns that run substantially perpendicularly to the extent of the main region, and by subsequent removal or etching back of the material region for the control gates to a point below the level of the surface region of the material region for the intermediate insulation region so that the material region for the control gates remains only in the region of the side regions of the main region, in particular, the material region for the intermediate insulation region not being removed.

Preferably, the structure so obtained is embedded in an insulation region and subsequently formed with a contact connection to the source/drain regions and/or the control gates.

The above-described and further aspects of the present invention are also explained based upon the remarks in the following text:

In flash memory cells, it is possible to store a plurality of bits per cell by storing different charge states or by storing a respective bit at spatially separate locations. However, the last-mentioned possibility has, hitherto, necessitated the use of a so-called charge-trapping device. This means, for example, that the charge is stored in a nitride layer.

The present invention presents a different approach, in which a floating gate cell can be realized for storing two or more bits in one cell.

The storage of two bits in one flash cell has been realized, heretofore, either by the use of an $Si_3N_4$ layer (NROM concept). Floating gate cells have, heretofore, used exclusively the storage of a plurality of charge states in a floating gate for storing a plurality of bits in one cell.

By fabricating Si lamellae, it is possible to realize a floating gate cell that has two floating gates but is supplied through the same source and drain regions. As a result, one or even a plurality of bits can be stored in each of the two floating gates.

A core idea is that the channel of the transistor is shifted from the Si surface to the surface of an Si lamella. Such shifting makes it possible to provide a respective floating gate at two locations of the lamella and, thus, to store two or more bits in the cell.

The function of the memory cell is explained in the following text.

If the component, that is to say, the floating gate memory cell, is processed in the manner described below, then an inversion channel can be produced at the left-hand and right-hand sides of the component both with the first control gate and with the second control gate. Each of these channels can be utilized as a separate memory cell area because the gate voltage can be set separately for each side of the component during programming and erasure.

During programming, the methods are possible by hot electrons or by Fowler-Nordheim tunneling. During erasure, it is possible to have recourse substantially to Fowler-Nordheim tunneling from the floating gate either to source, drain, or channel (or a combination). The programming by hot electrons can be carried out either jointly for both bits or separately for each bit.

It is an important innovation in the case of such a component that, although two gate regions are available for storage and driving, they are supplied only by in each case a common source/drain region.

The fabrication of a memory cell according to the invention is described in the following text.

The incorporation of a memory cell into an array is possible in a plurality of architectures (common ground NOR, virtual Ground NOR etc.). The latter differ in each case by the extent to which one of the source/drain regions is additionally utilized by further cells and, therefore, if appropriate, need not be separately contact-connected. The incorporation into different array architectures is effected analogously to conventional flash cells. Equally, the contact connection of the control gates is not described below. Such a contact connection is effected, in principle, at the array edge, and both control gates can be contact-connected on one side, or the control gates can be contact-connected on respectively opposite sides of the array.

Other features that are considered as characteristic for the invention are set forth in the appended claims.

Although the invention is illustrated and described herein as embodied in a floating gate memory cell, method for fabricating it and semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures of the drawings, unless stated otherwise, identical reference symbols denote identical parts.

Referring now to the figures of the drawings in detail and first, particularly to FIGS. 1A to 2C thereof, there is shown, in lateral cross-sectional view and in plan view, a first intermediate state of an embodiment of the fabrication method according to the invention. A semiconductor substrate region 20 with a substantially planar surface 20*a* is provided. The semiconductor substrate region or material region 20 may be a p-doped (or n-doped) silicon material or the like. The latter may already be processed and provided, e.g., with suitable wells. Mask regions 100, which serve to form corresponding doping regions 21 (see FIGS. 2A to 2C), are applied in strip form. This is done by implantation in the arrow direction.

Figure 1A:
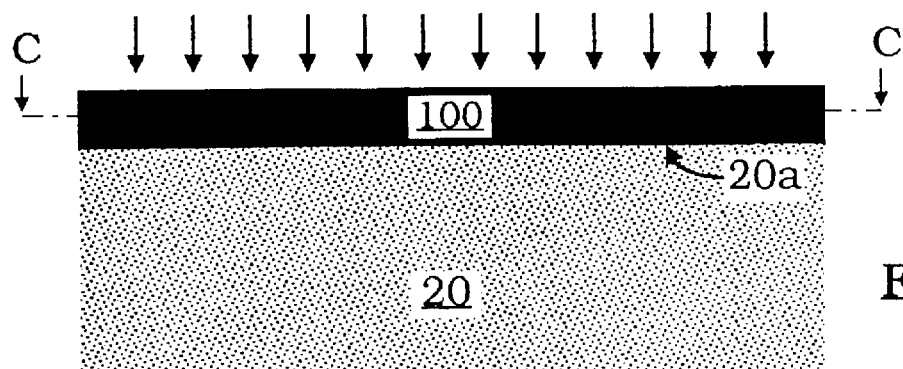
FIG. 1A is a cross-sectional side view of an intermediate state reached in the fabrication method according to the invention along the sectional plane A—A of FIG. 1C.
Figure 1B:
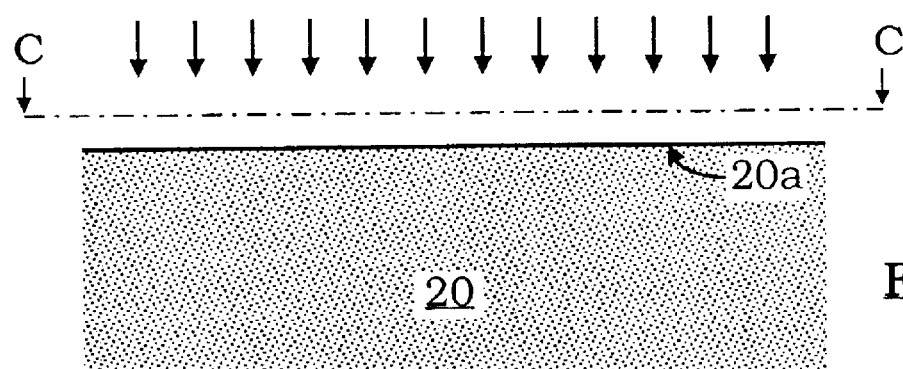
FIG. 1B is a cross-sectional side view of an intermediate state reached in the fabrication method according to the invention along the sectional plane B—B of FIG. 1C.
Figure 1C:
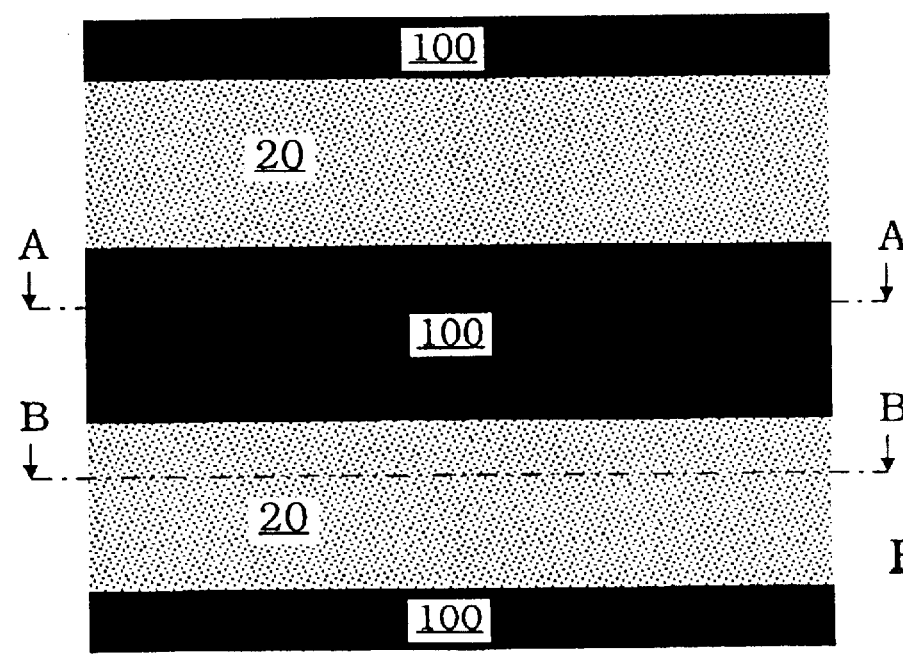
FIG. 1C is a cross-sectional plan view of an intermediate state reached in the fabrication method according to the invention along the sectional plane C—C of FIGS. 1A and 1B.
Figure 2A:
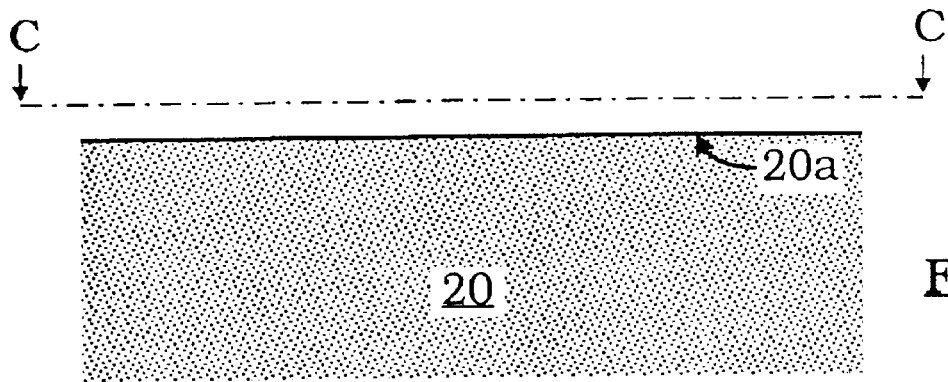
FIG. 2A is a cross-sectional side view of an intermediate state reached in the fabrication method according to the invention along the sectional plane A—A of FIG. 2C.
Figure 2B:
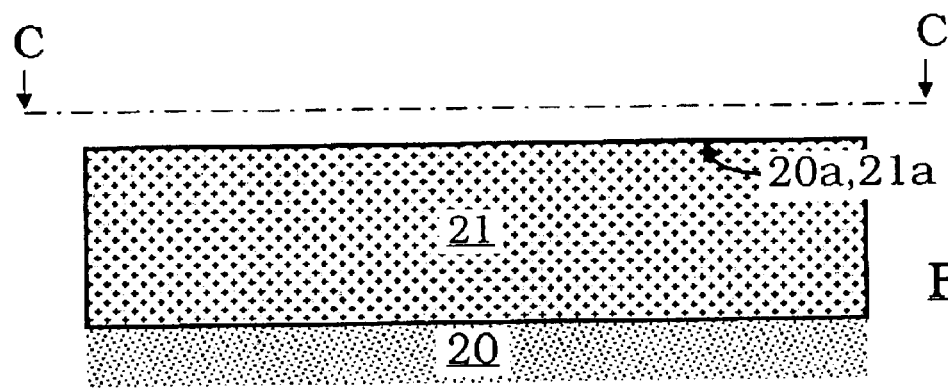
FIG. 2B is a cross-sectional side view of an intermediate state reached in the fabrication method according to the invention along the sectional plane B—B of FIG. 2C.
Figure 2C:
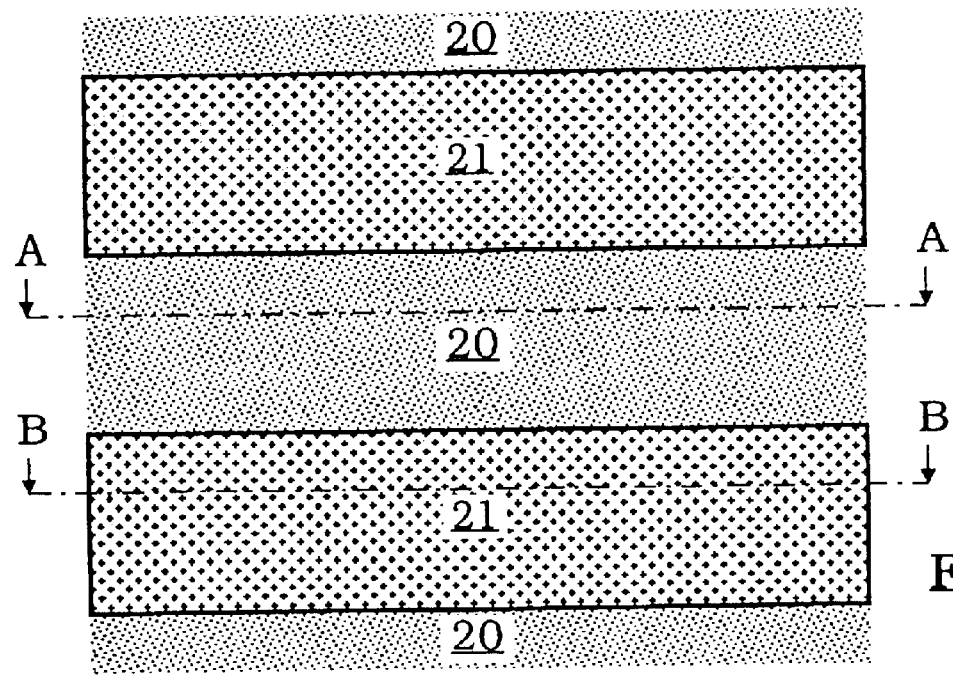
FIG. 2C is a cross-sectional plan view of an intermediate state reached in the fabrication method according to the invention along the sectional plane C—C of FIGS. 2A and 2B.
Figure 3A:
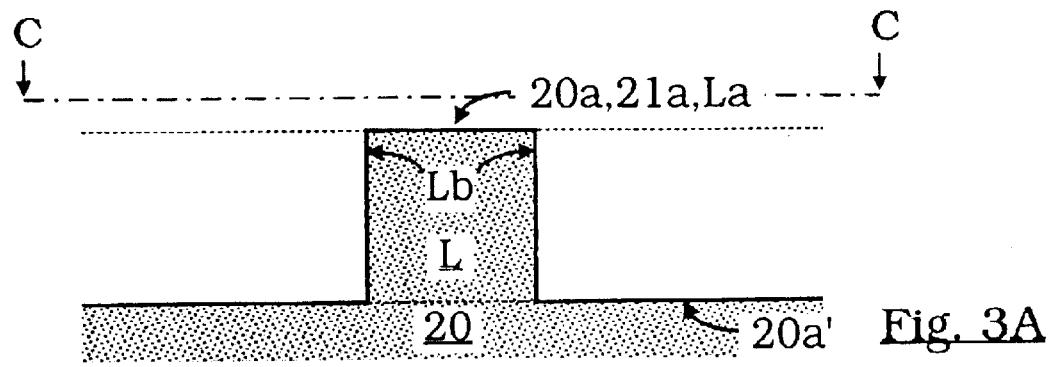
FIG. 3A is a cross-sectional side view of an intermediate state reached in the fabrication method according to the invention along the sectional plane A—A of FIG. 3C.

In the transition to the intermediate state shown in FIGS. 2A to 2C, a doping region 21 is formed locally in the surface region 20*a* of the semiconductor material region 20 and to a certain depth underneath, for example, in the form of an $n^+$-doped (or $p^+$-doped) silicon material region, by a corresponding implantation technique. The doping regions 21 formed have a substantially planar surface 21*a*. FIG. 2C shows a plan view of the locally doped semiconductor material 20, and FIGS. 2A and 2B show corresponding cross-sectional side views along the sectional planes A—A and B—B, respectively. The formation of the doping regions 21 results in the creation, by implantation, of a precursor of the source/drain regions SD1 and SD2 (see FIG. 3C) to be formed for each of the floating gate memory cells 10 (see FIGS. 11A to 11C).

Afterward, the semiconductor material 20 with the corresponding doping regions 21 is patterned, thereby producing corresponding silicon lamellae L as main regions L for the floating gate memory cells 10 to be formed. As emerges from the plan view of FIG. 3C and the sectional side views 3A and 3B, the lamella L has, as main region L, a substantially linearly extended parallelepiped structure with side regions Lb and a surface region La, which is configured to be substantially planar. By the etching process, in the transition to the intermediate state shown in FIGS. 3A to 3C, the surface region 20a of the semiconductor substrate region 20 is etched back to a surface region 20a', thereby uncovering the corresponding structure of the lamella L.

In principle, in the context of such an etching step, it is possible to form a multiplicity of lamellae that are spaced apart parallel and equidistantly in the manner of a bar grating on the surface region 20a or 20a' of the semiconductor substrate region 20, for example, in the context of a fabrication method for simultaneously producing a multiplicity of floating gate memory cells of a semiconductor memory device.

Figure 3B:
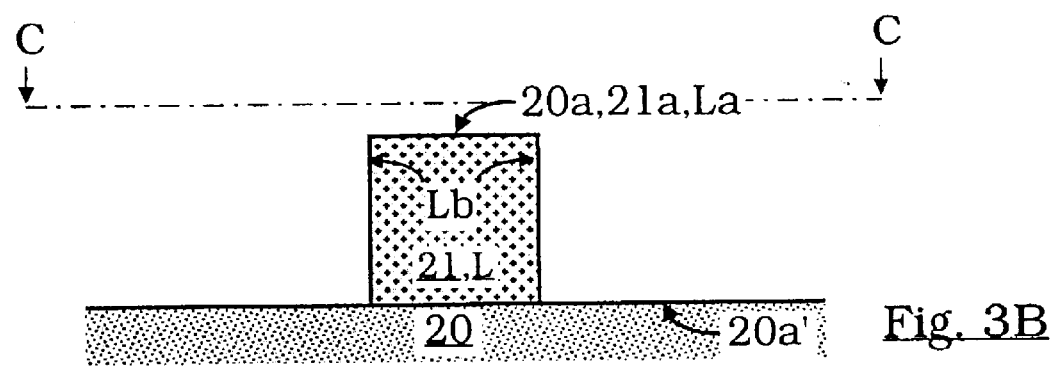
FIG. 3B is a cross-sectional side view of an intermediate state reached in the fabrication method according to the invention along the sectional plane B—B of FIG. 3C.
Figure 3C:
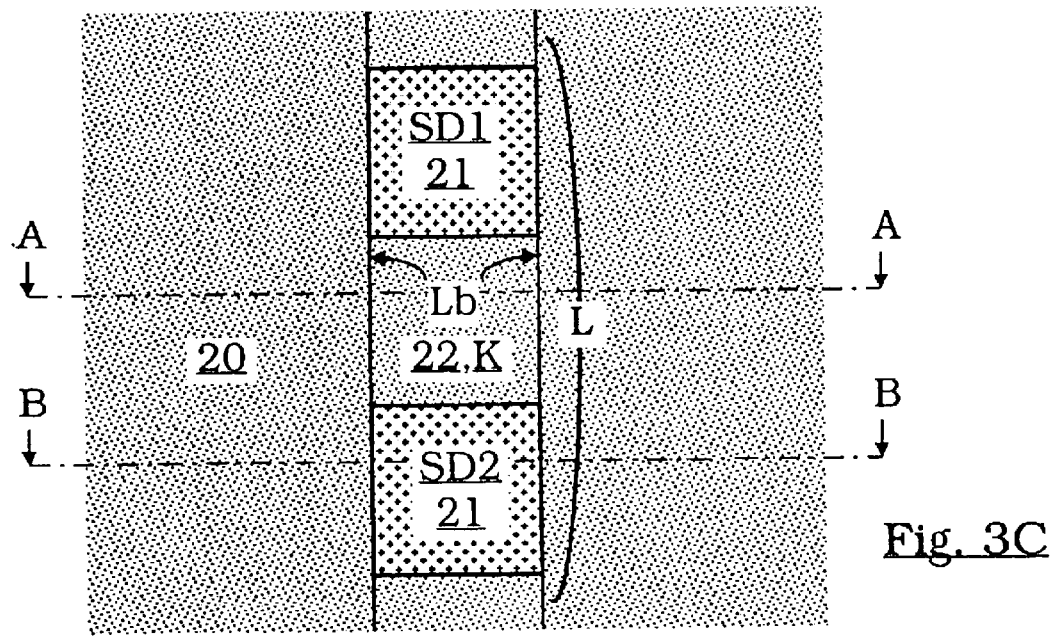
FIG. 3C is a cross-sectional plan view of an intermediate state reached in the fabrication method according to the invention along the sectional plane C—C of FIGS. 3A and 3B.

As emerges from FIG. 3B, the semiconductor material region or semiconductor substrate region 20 is etched back to form the main regions or lamellae L by a depth that approximately corresponds to the depth of the doping or implantation in the doping regions 21. If appropriate, an overetching may also take place to better separate the doped regions from one another.

The remaining regions SD1, SD2 of the doping regions 21 serve as source/drain regions SD1, SD2 of the source/drain configuration SD. In between lies the region 22, the channel region K.

Figure 4A:
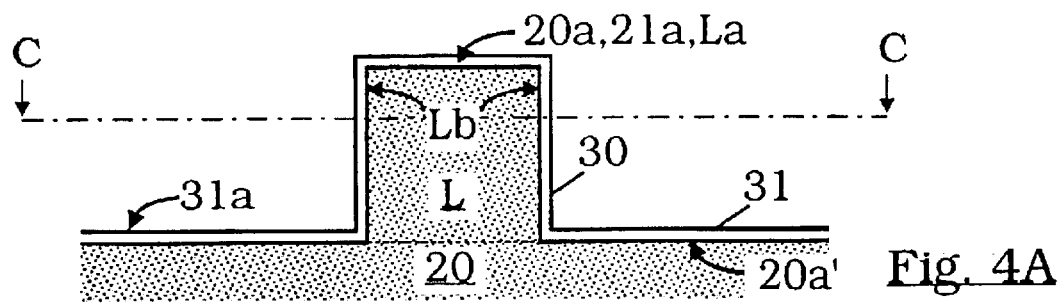
FIG. 4A is a cross-sectional side view of an intermediate state reached in the fabrication method according to the invention along the sectional plane A—A of FIG. 4C.
Figure 4B:
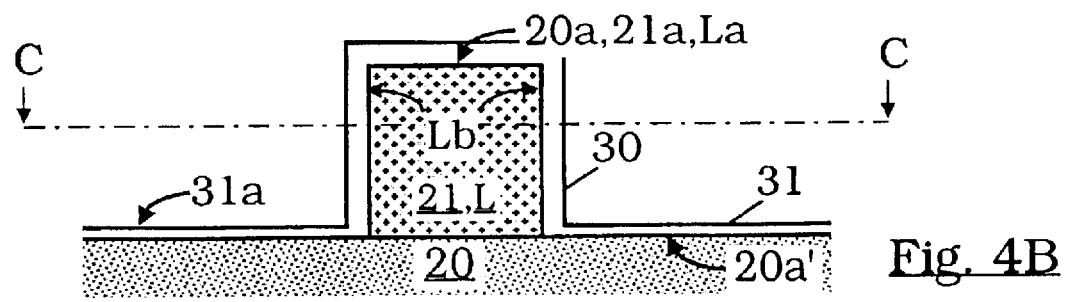
FIG. 4B is a cross-sectional side view of an intermediate state reached in the fabrication method according to the invention along the sectional plane B—B of FIG. 4C.
Figure 4C:
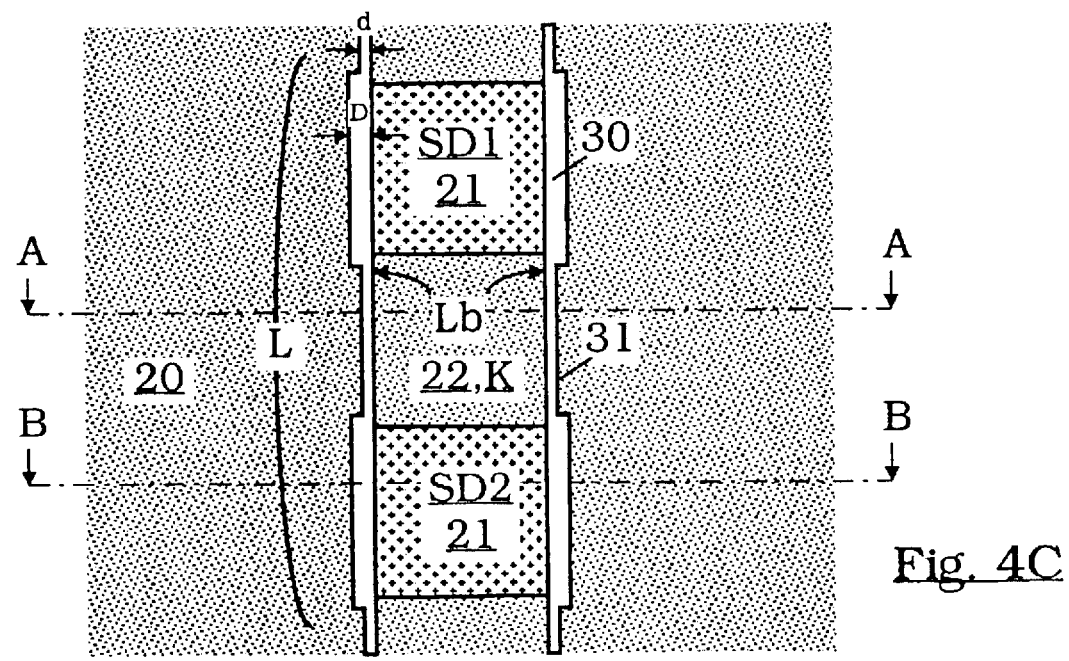
FIG. 4C is a cross-sectional plan view of an intermediate state reached in the fabrication method according to the invention along the sectional plane C—C of FIGS. 4A and 4B.

In the transition to the state of FIGS. 4A to 4C, an insulation layer 31 is, then, formed over the whole area and/or conformally, for example, by growth or deposition. In such a case, at the side regions Lb of the lamellae L, insulation regions 30 are produced as part of the insulation layer 31, which substantially extend vertically there and serve for insulating the floating gates to be formed from the channel region 22 and from the doping regions 21.

The insulation layer 31 can be formed strictly conformally or else, as revealed in the comparison of FIGS. 4A to 4C, be formed with a larger layer thickness D in the region of the doping regions 21 compared with the otherwise thinner layer thickness d. The larger layer thickness D results quite automatically in the case of high dopings, for example, in the case of $n^+$-type silicon, and has the advantage that a lower capacitance is, thus, present between control gate G1, G2 (see FIGS. 9A to 9C) and respective source/drain region SD1 or SD2.

Figure 5A:
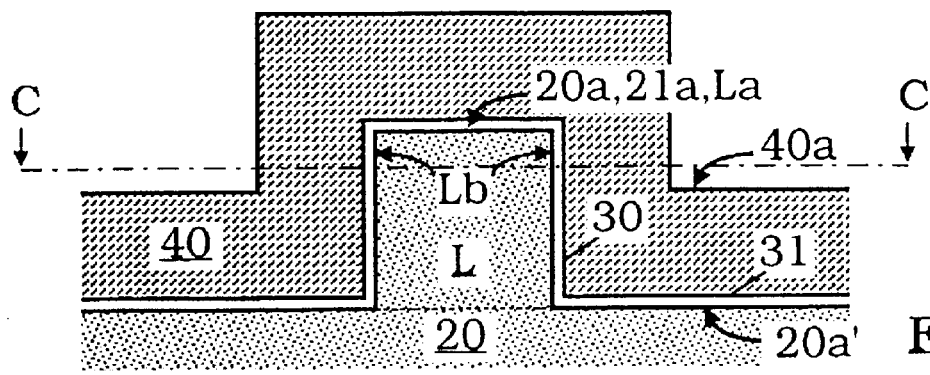
FIG. 5A is a cross-sectional side view of an intermediate state reached in the fabrication method according to the invention along the sectional plane A—A of FIG. 5C.
Figure 5B:
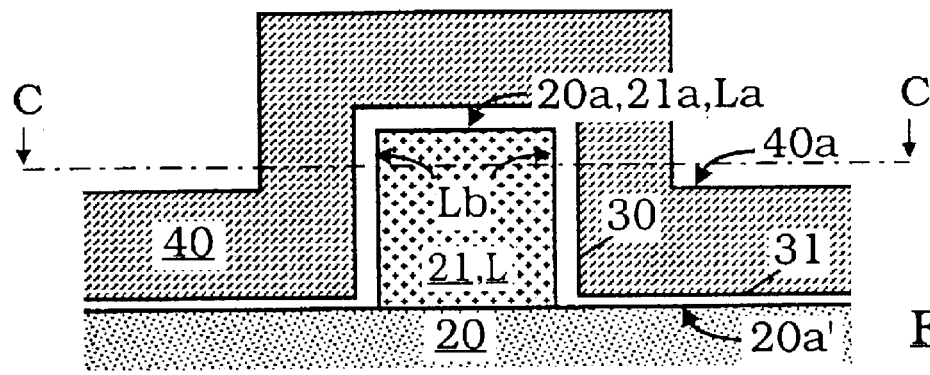
FIG. 5B is a cross-sectional side view of an intermediate state reached in the fabrication method according to the invention along the sectional plane B—B of FIG. 5C.
Figure 5C:
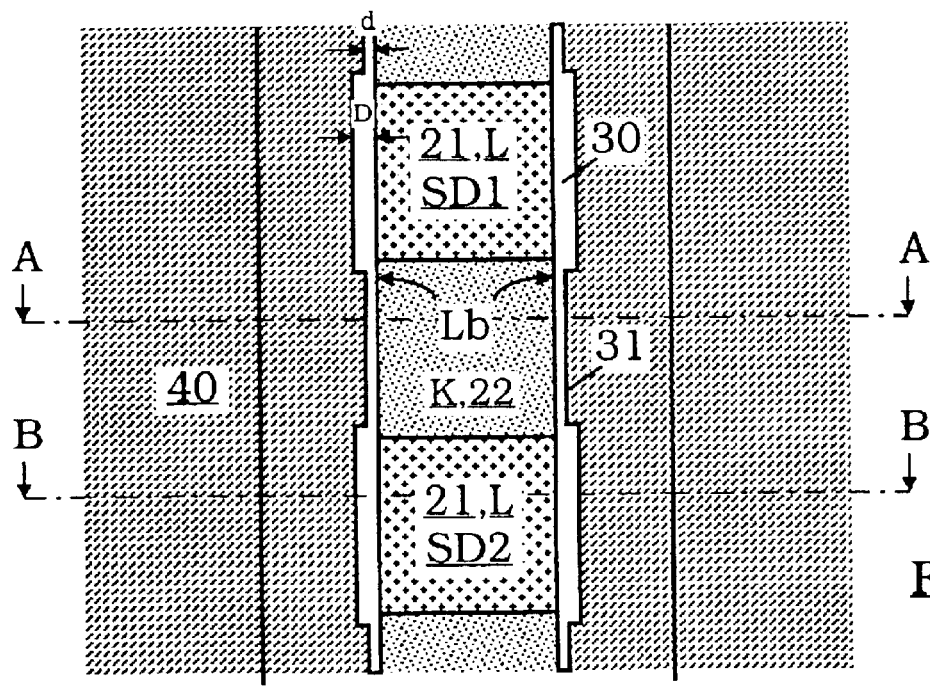
FIG. 5C is a cross-sectional plan view of an intermediate state reached in the fabrication method according to the invention along the sectional plane C—C of FIGS. 5A and 5B.

A material layer 40 for the floating gates F1, F2 (see FIGS. 7A to 7C) of the floating gate configuration F that are to be formed is applied in a manner directly adjoining the insulation layer 30, 31, in particular, by deposition. In such a case, a polysilicon material 40 was used in the intermediate state of the fabrication method according to the invention as shown in FIGS. 5A to 5C. The deposition or formation of such polysilicon for the floating gates F1, F2 is effected over the whole area.

Figure 6A:
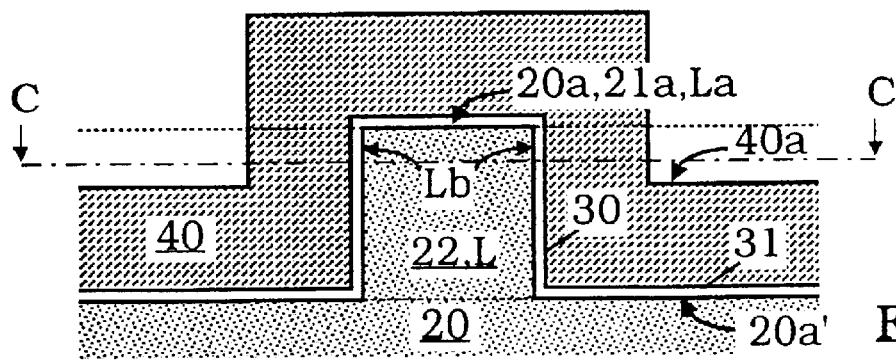
FIG. 6A is a cross-sectional side view of an intermediate state reached in the fabrication method according to the invention along the sectional plane A—A of FIG. 6C.
Figure 6B:
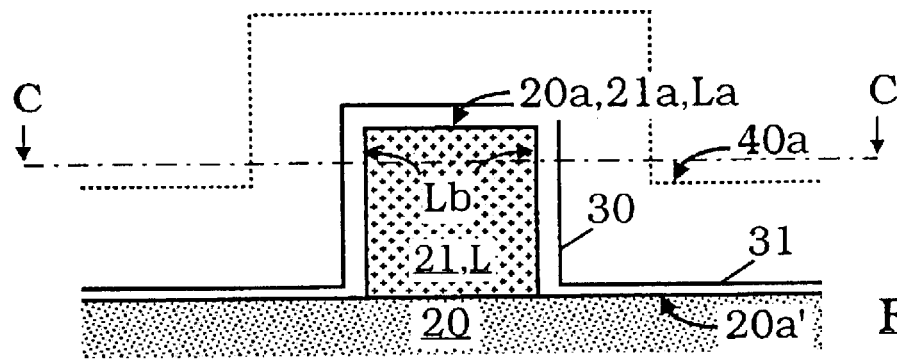
FIG. 6B is a cross-sectional side view of an intermediate state reached in the fabrication method according to the invention along the sectional plane B—B of FIG. 6C.
Figure 6C:
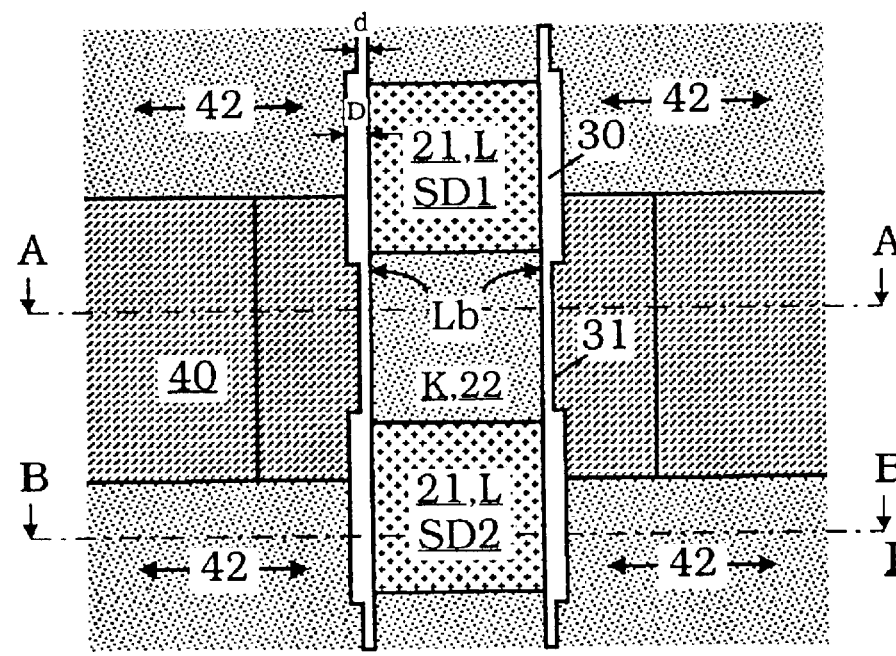
FIG. 6C is a cross-sectional plan view of an intermediate state reached in the fabrication method according to the invention along the sectional plane C—C of FIGS. 6A and 6B.

As is shown in FIGS. 6A to 6C, the floating gates F1 and F2 are, then, formed by patterning the material region 40 for the floating gates F1, F2. To that end, columns 42 or recesses 42 are formed by etching, which run substantially perpendicularly to the direction of extent of the main regions L of the memory cells 10 to be formed. In such a case, in this first patterning step, as is shown in FIGS. 1A through 6C, the material region 40 for the floating gates F1, F2 remains only in the overlap region with respect to the channel region K, 22 to be formed and in a column containing the channel region 22, K perpendicularly to the direction of extent of the main region L. In such a case, the material region 40 for the floating gates F1, F2 can significantly overlap the source/drain regions SD1, SD2 to be formed, that is to say, the doping regions 21.

Figure 7A:
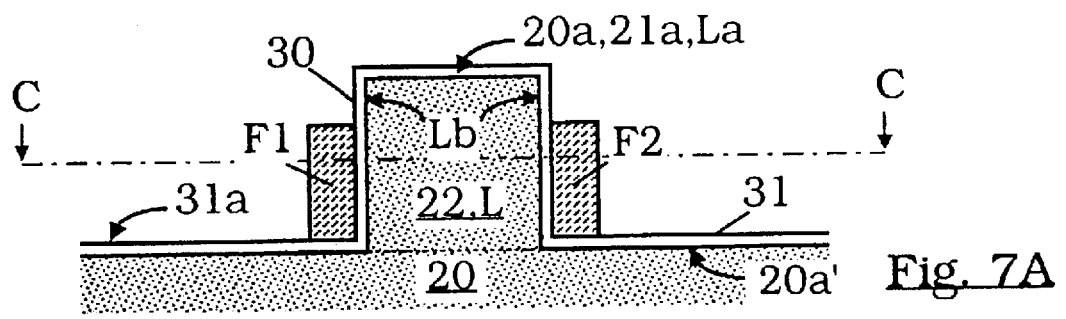
FIG. 7A is a cross-sectional side view of an intermediate state reached in the fabrication method according to the invention along the sectional plane A—A of FIG. 7C.
Figure 7B:
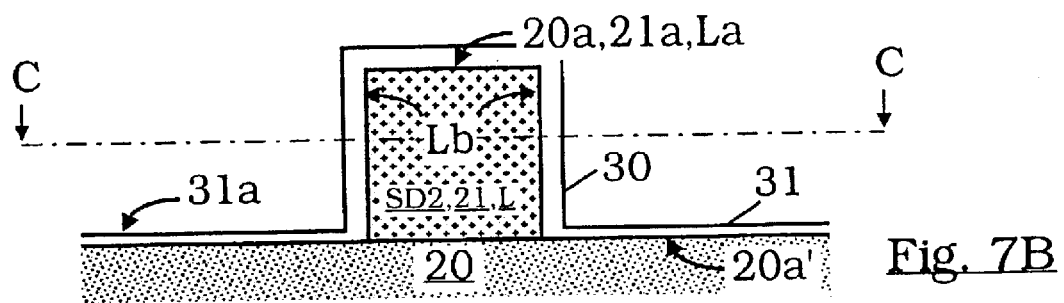
FIG. 7B is a cross-sectional side view of an intermediate state reached in the fabrication method according to the invention along the sectional plane B—B of FIG. 7C.
Figure 7C:
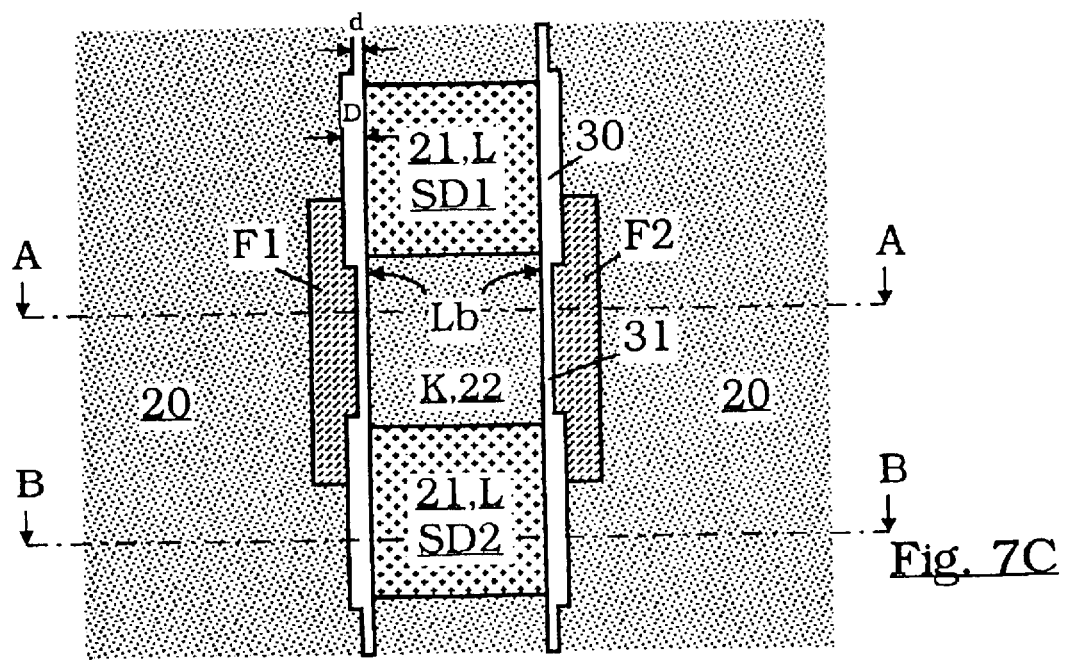
FIG. 7C is a cross-sectional plan view of an intermediate state reached in the fabrication method according to the invention along the sectional plane C—C of FIGS. 7A and 7B.

In the transition to the intermediate state shown in FIGS. 7A to 7C, the material region 40 for the floating gates to be formed is, then, etched back over the whole area. The etching back is effected to a point below the level of the surface regions La and 20a' of the lamella L and of the drawn-back semiconductor substrate region 20, respectively, so that the material 40 for the floating gates F1 and F2 to be formed remains only in the region of the side regions Lb of the main region L. Thus, the two floating gates F1, F2 are formed precisely in the side regions Lb of the lamellae L in a form insulated from the doping regions 21 and from the semiconductor substrate region 20 by the insulation regions 30, 31.

Figure 8A:
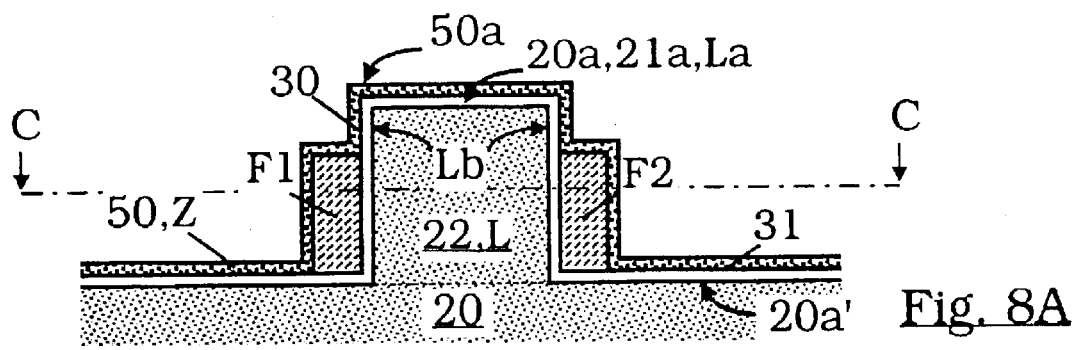
FIG. 8A is a cross-sectional side view of an intermediate state reached in the fabrication method according to the invention along the sectional plane A—A of FIG. 8C.
Figure 8B:
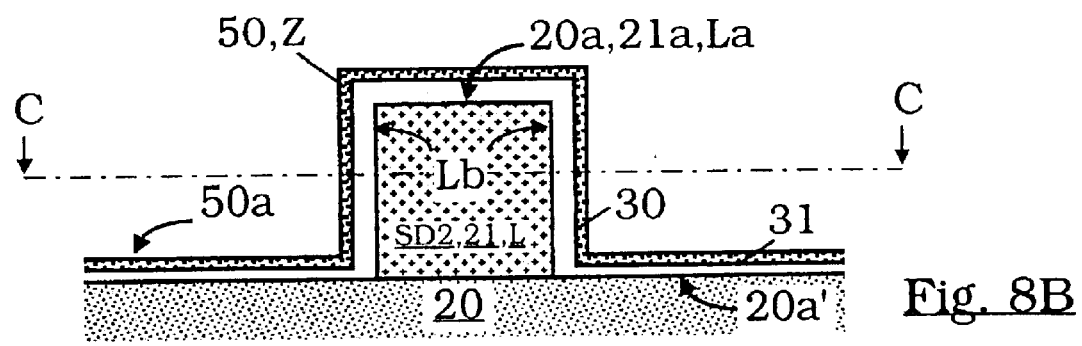
FIG. 8B is a cross-sectional side view of an intermediate state reached in the fabrication method according to the invention along the sectional plane B—B of FIG. 8C.
Figure 8C:
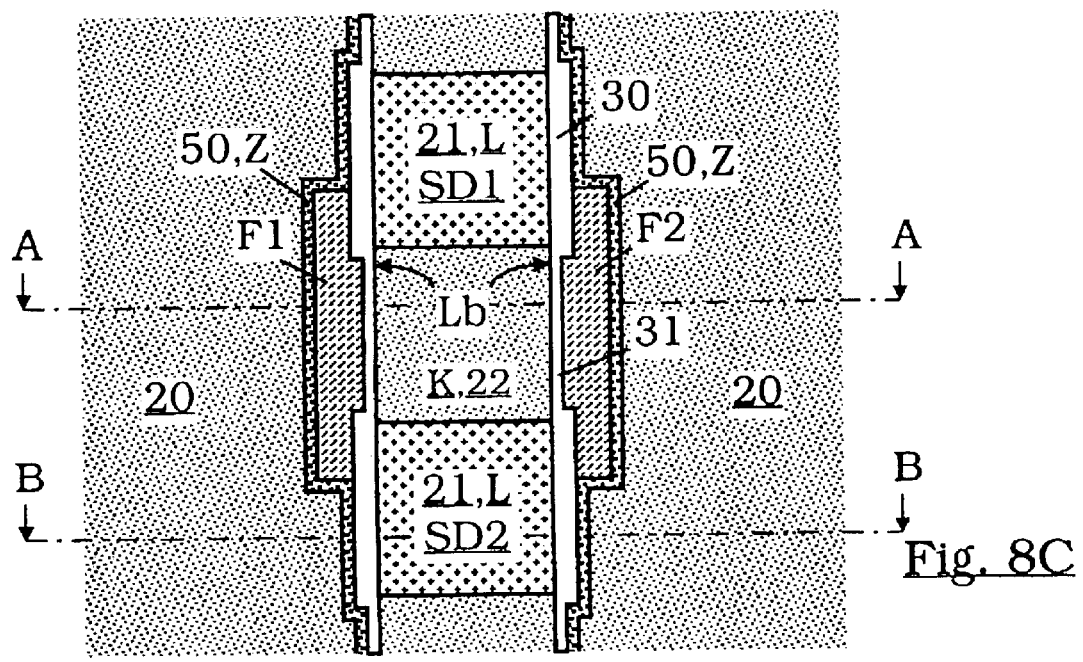
FIG. 8C is a cross-sectional plan view of an intermediate state reached in the fabrication method according to the invention along the sectional plane C—C of FIGS. 8A and 8B.

In the transition to the intermediate state shown in FIGS. 8A to 8C, a material region 50 for the intermediate insulation region Z to be formed is, then, formed conformally in a whole-area manner, in particular, by a deposition process. Such an intermediate insulation region is also referred to as an interpoly dielectric.

Figure 9A:
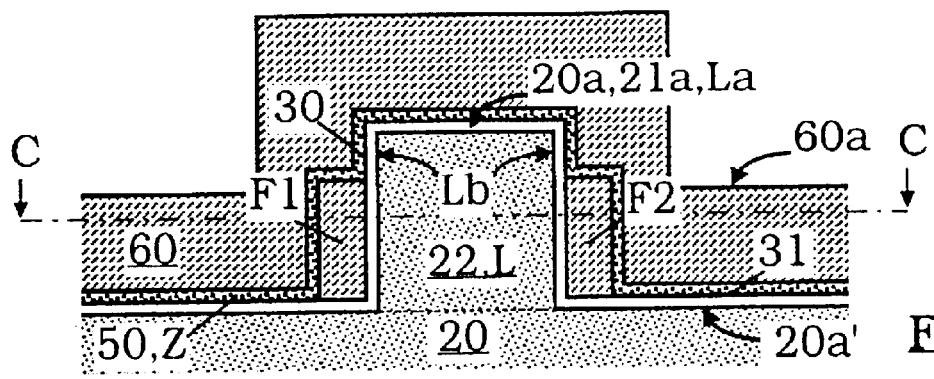
FIG. 9A is a cross-sectional side view of an intermediate state reached in the fabrication method according to the invention along the sectional plane A—A of FIG. 9C.
Figure 9B:
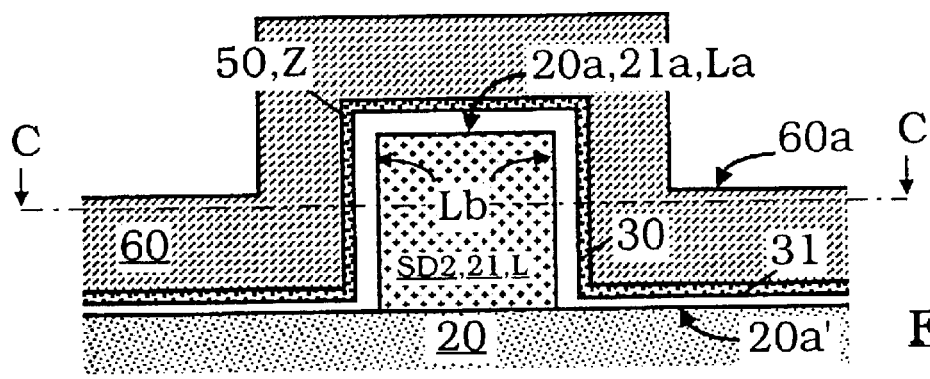
FIG. 9B is a cross-sectional side view of an intermediate state reached in the fabrication method according to the invention along the sectional plane B—B of FIG. 9C.
Figure 9C:
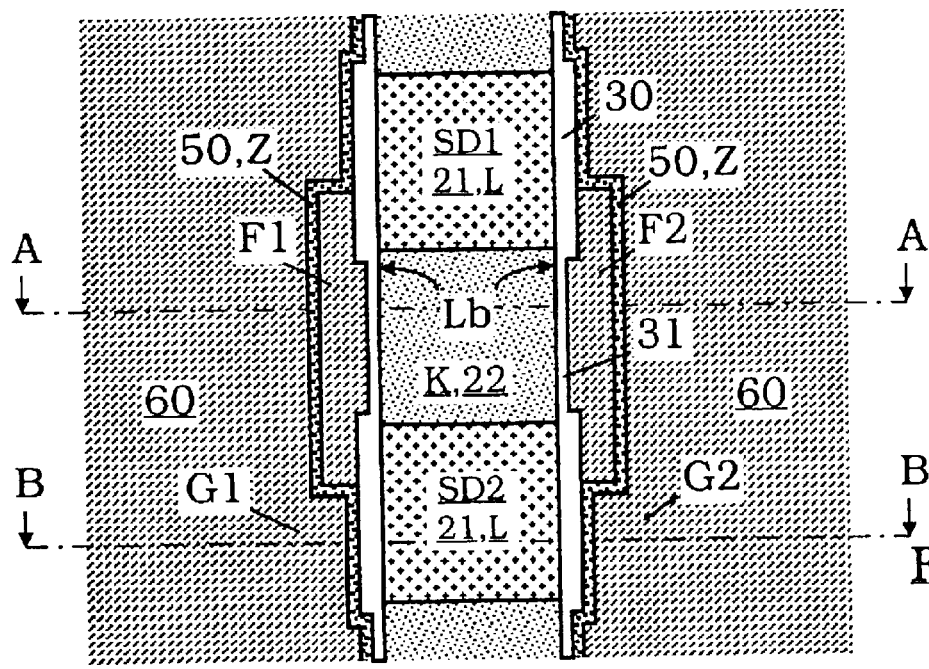
FIG. 9C is a cross-sectional plan view of an intermediate state reached in the fabrication method according to the invention along the sectional plane C—C of FIGS. 9A and 9B.

The formation is followed directly afterward by the deposition of a material region 60 for the control gates G1 and G2 to be formed. The intermediate state in FIGS. 9A to 9C is a whole-area polysilicon deposition. If appropriate, a deposition of polycide, metal, and/or the like is conceivable.

Figure 10A:
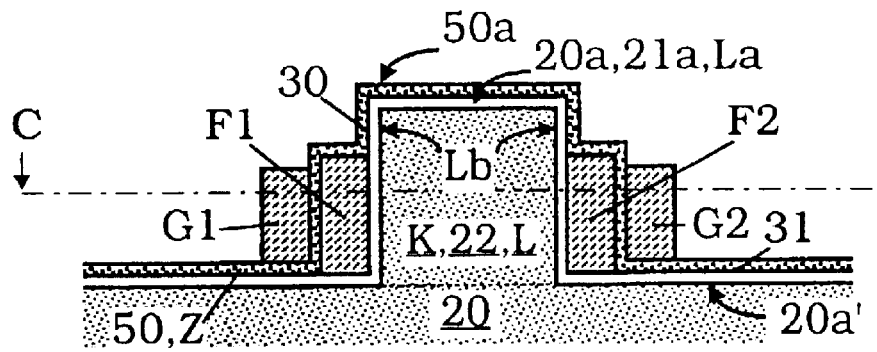
FIG. 10A is a cross-sectional side view of an intermediate state reached in the fabrication method according to the invention along the sectional plane A—A of FIG. 10C.
Figure 10B:
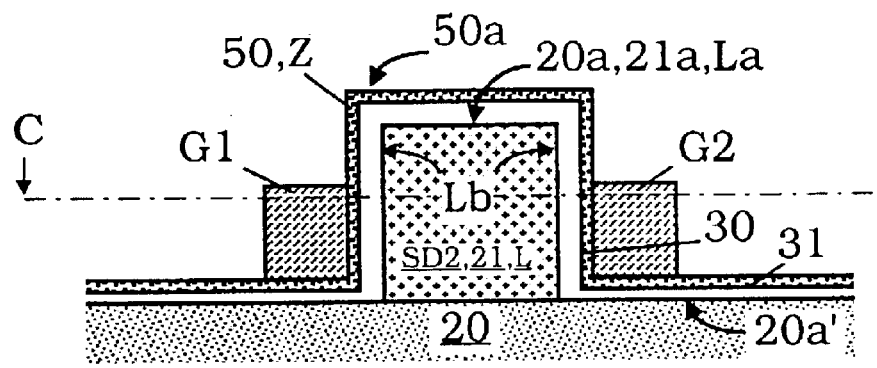
FIG. 10B is a cross-sectional side view of an intermediate state reached in the fabrication method according to the invention along the sectional plane B—B of FIG. 10C.
Figure 10C:
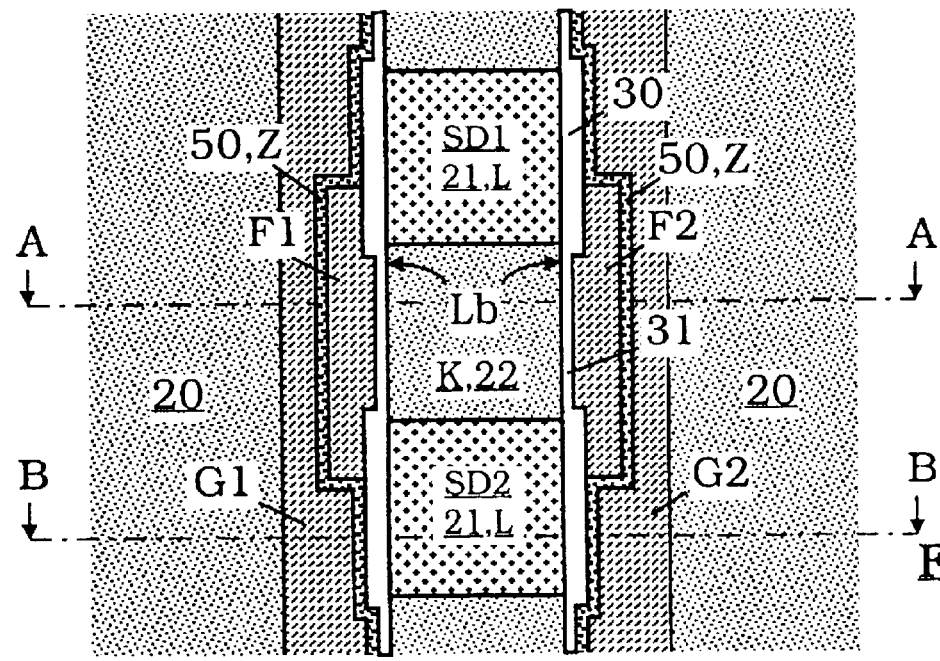
FIG. 10C is a cross-sectional plan view of an intermediate state reached in the fabrication method according to the invention along the sectional plane C—C of FIGS. 10A and 10B.

In the transition to the intermediate state in FIGS. 10A to 10C, the control gates G1 and G2 are, then, patterned. The patterning is performed by whole-area anisotropic etching back so that the material 60 for the control gates G1 and G2 remains only at the edge of the lamella L adjacent to the floating gates F1 and F2. A significant overetching is provided in a manner similar to that when forming the floating gates F1 and F2. This is not necessary, however, with the use of source/drain contacts.

In the edge region, a masked etching is additionally necessary—as in the case of the floating gates F1, F2—in order to isolate the control gates G1, G2. These processes are not explicitly illustrated here.

Figure 11A:
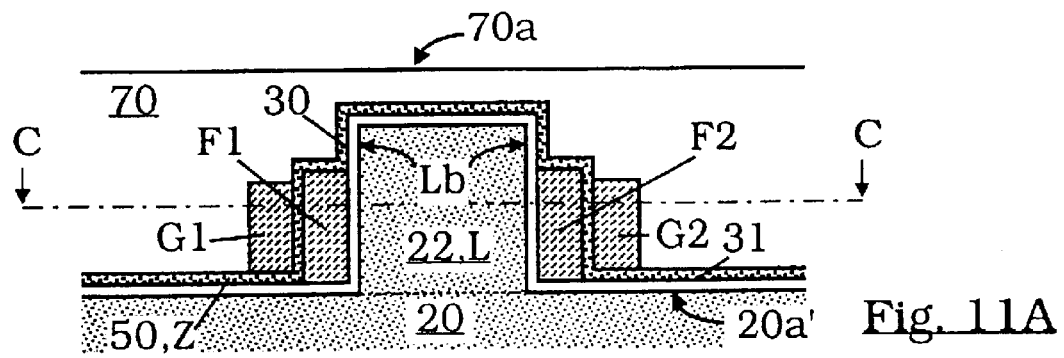
FIG. 11A is a cross-sectional side view of an intermediate state reached in the fabrication method according to the invention along the sectional plane A—A of FIG. 11C.
Figure 11B:
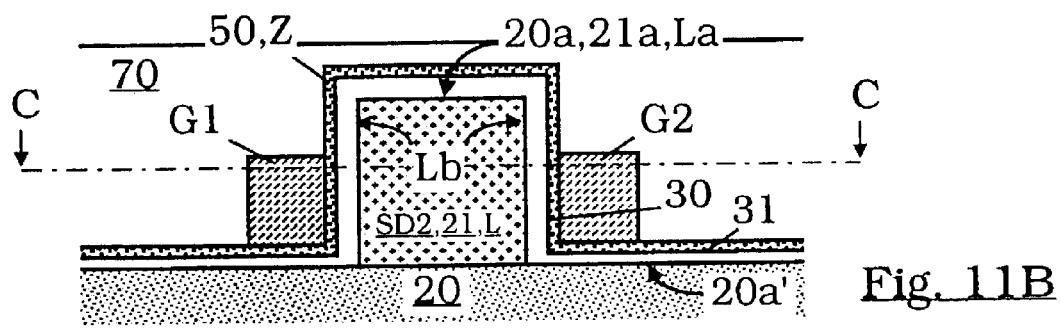
FIG. 11B is a cross-sectional side view of an intermediate state reached in the fabrication method according to the invention along the sectional plane B—B of FIG. 11C.
Figure 11C:
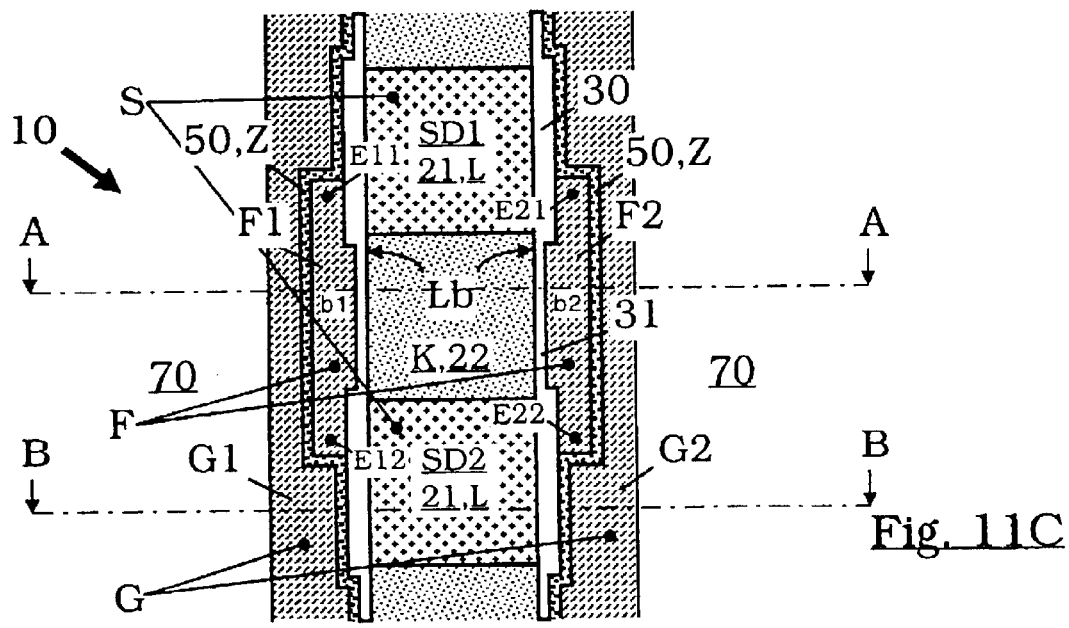
FIG. 11C is a cross-sectional plan view of an intermediate state reached in the fabrication method according to the invention along the sectional plane C—C of FIGS. 11A and 11B.

In the transition to the intermediate state shown in FIGS. 11A to 11C, embedding in a further insulation region 70, for example, in the form of a silicon dioxide, is, then, effected.

The above-described patterning has, thus, produced a floating gate memory cell 10 in which a floating gate region F has two floating gates F1 and F2 that are spatially separate from one another, in which a control gate region G has control gates G1 and G2 that are spatially separate from one another and face the respective floating gates F1 and F2, and in which the source/drain region SD has common first and second source/drain regions SD1, SD2 for both gate structures.

As a rule, such a procedure does not produce a single floating gate memory cell 10 locally, but rather, in a spatially extended semiconductor substrate region 20, a multiplicity of floating gate memory cells 10 disposed in matrix form for forming a semiconductor memory device according to the invention for nonvolatile information storage.

In principle, two different process implementations are conceivable for the respective contact connection of the source/drain regions SD1 and SD2.

To obtain a cell area that is as small as possible, a lithographic definition of contact holes is dispensed with. The removal of the insulation layers 70, 50, 31 above the source/drain regions SD1 and SD2 is effected either by chemical mechanical polishing or CMP with a stop on the surfaces of the source/drain regions or by etching. Such a procedure is illustrated in FIGS. 12A to 13C.

With the use of contactless architecture, metal interconnects can be completely dispensed with. Then, exclusively the buried bit and source lines are used.

In the last-mentioned case, the lamella is not etched out to a depth such that the doping regions/diffusion regions for the source/drain regions would, thereby, be electrically isolated.

Figure 12A:
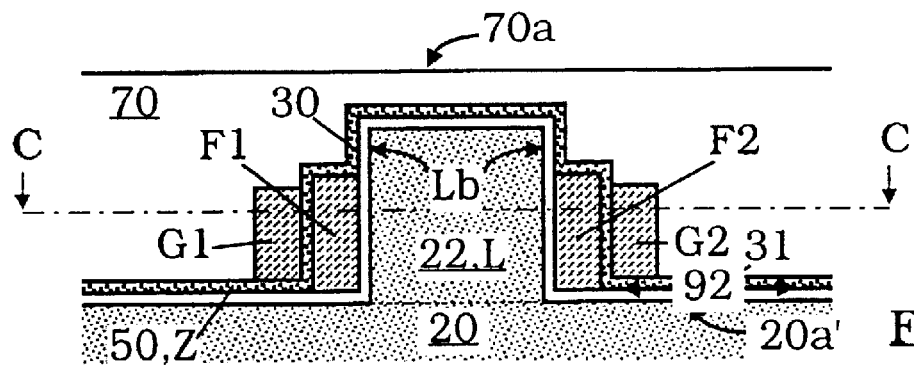
FIG. 12A is a cross-sectional side view of an alternative embodiment of the contact connection process according to the invention along the sectional plane A—A of FIG. 12C.
Figure 12B:
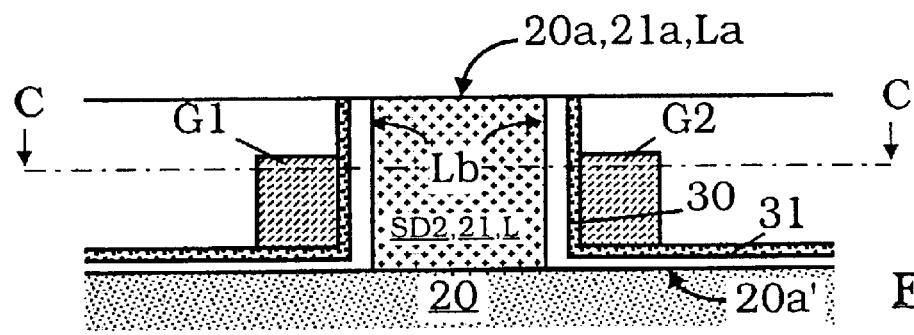
FIG. 12B is a cross-sectional side view of the alternative embodiment of the contact connection process according to the invention along the sectional plane B—B of FIG. 12C.
Figure 12C:
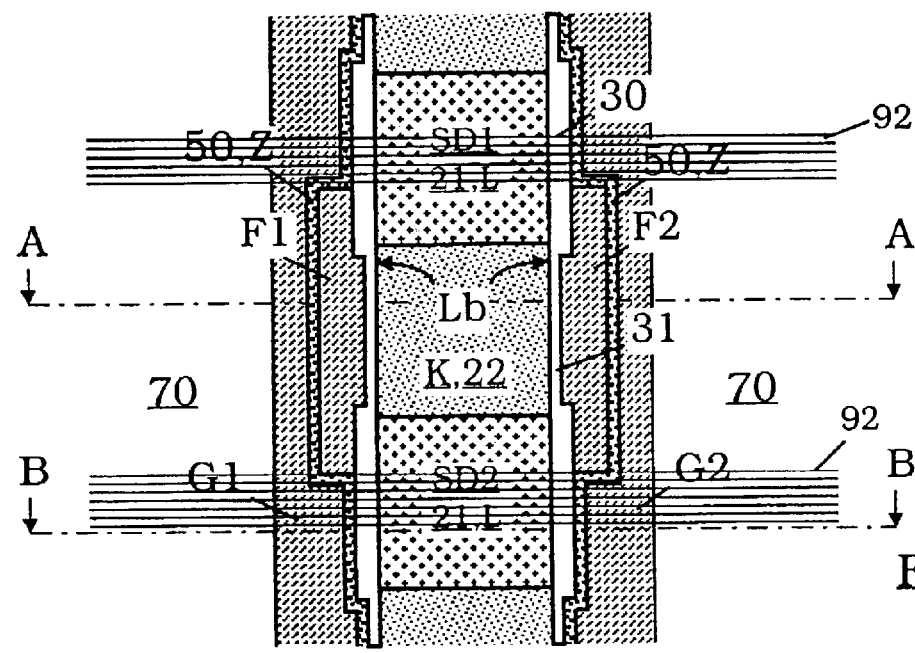
FIG. 12C is a cross-sectional plan view of the alternative embodiment of the contact connection process according to the invention along the sectional plane C—C of FIGS. 12A and 12B.

As is shown in the state of FIGS. 12A to 12C, strip-like etching free is effected by a mask configuration for the bit lines or source/drain line devices.

Figure 13A:
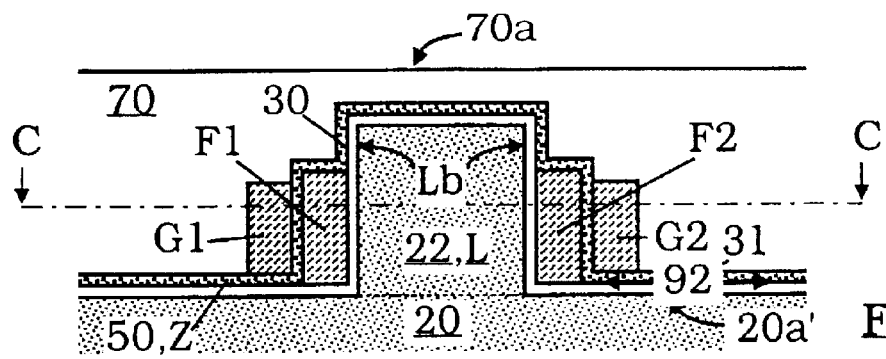
FIG. 13A is a cross-sectional side view of the alternative embodiment of the contact connection process according to the invention along the sectional plane A—A of FIG. 13C.
Figure 13B:
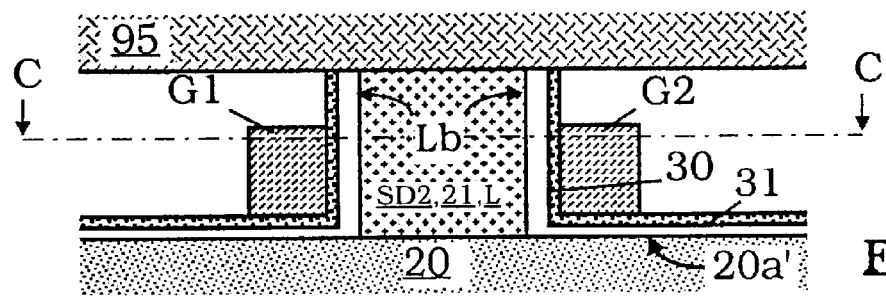
FIG. 13B is a cross-sectional side view of the alternative embodiment of the contact connection process according to the invention along the sectional plane B—B of FIG. 13C.
Figure 13C:
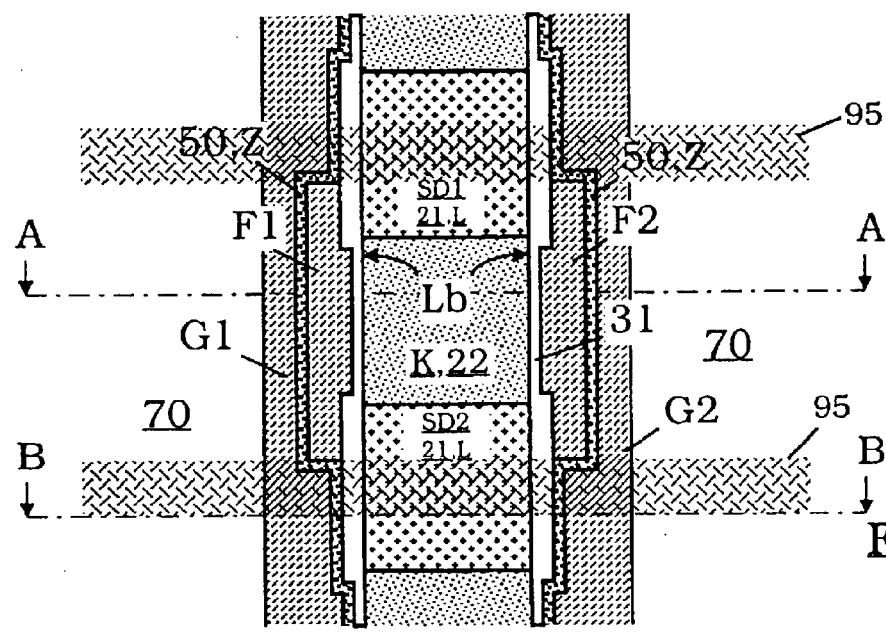
FIG. 13C is a cross-sectional plan view of the alternative embodiment of the contact connection process according to the invention along the sectional plane C—C of FIGS. 13A and 13B.

In the transition to the intermediate state shown in FIGS. 13A to 13C, a whole-area metal deposition is, then, effected for the purpose of contact connection, the recesses 92 in the insulation regions 70, 50, 30, 31 to the source/drain regions SD1, SD2 being filled with a corresponding metal 95. Electrical-insulations of these fillings 95 are, then, isolated from one another by etching back or polishing with a stop on the surface 70a of the embedding insulation region 70.

In a different contact connection process, to obtain a large process window and to avoid major overetching of the floating gates F1 and F2 and of the control gates G1 and G2, a contact connection to the source/drain regions SD1 and SD2 is provided. Such a procedure is illustrated in FIGS. 14A to 15B.

Figure 14A:
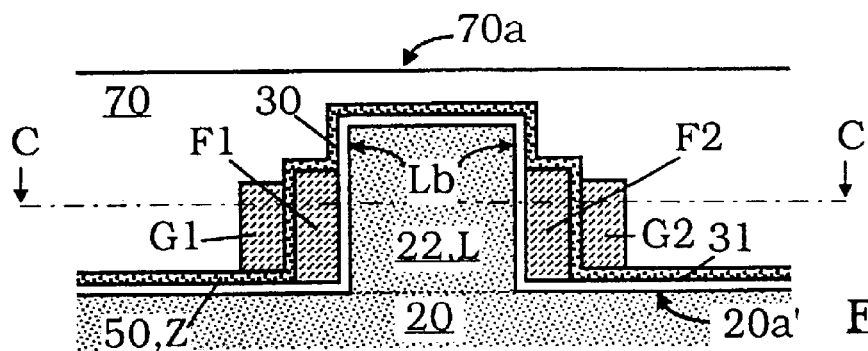
FIG. 14A is a cross-sectional side view of a third alternative embodiment of the contact connection process according to the invention along the sectional plane A—A of FIG. 14C.
Figure 14B:
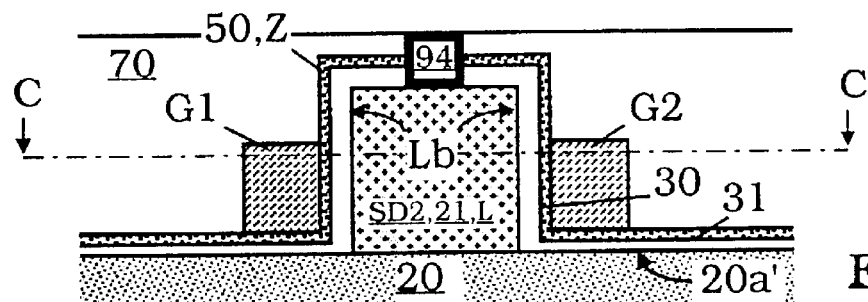
FIG. 14B is a cross-sectional side view of the third alternative embodiment of the contact connection process according to the invention along the sectional plane B—B of FIG. 14C.
Figure 14C:
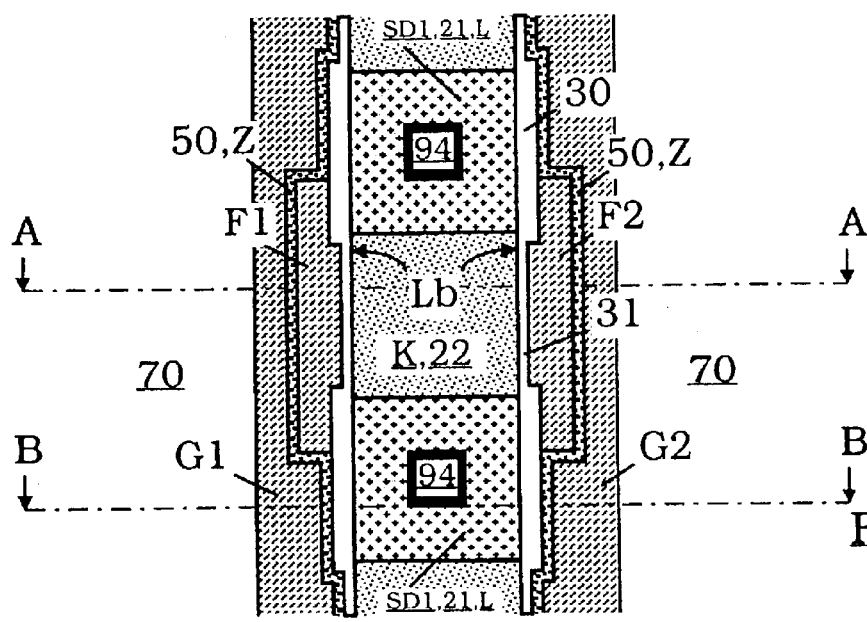
FIG. 14C is a cross-sectional plan view of the third alternative embodiment of the contact connection process according to the invention along the sectional plane C—C of FIGS. 14A and 14B.
Figure 15A:
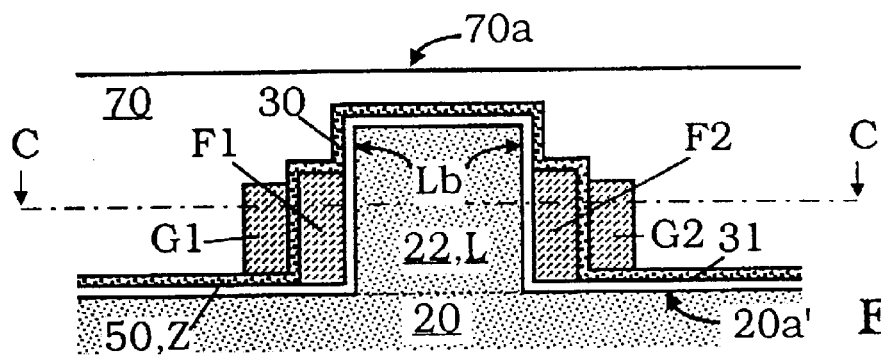
FIG. 15A is a cross-sectional side view of the third alternative embodiment of the contact connection process according to the invention along the sectional plane A—A of FIG. 15C.
Figure 15B:
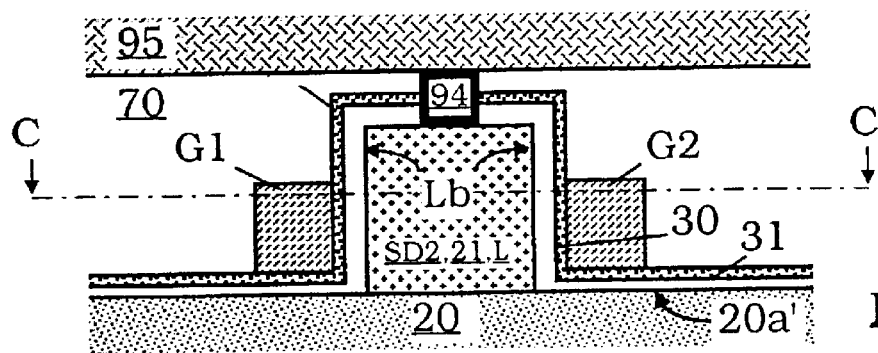
FIG. 15B is a cross-sectional side view of the third alternative embodiment of the contact connection process according to the invention along the sectional plane B—B of FIG. 15C.
Figure 15C:
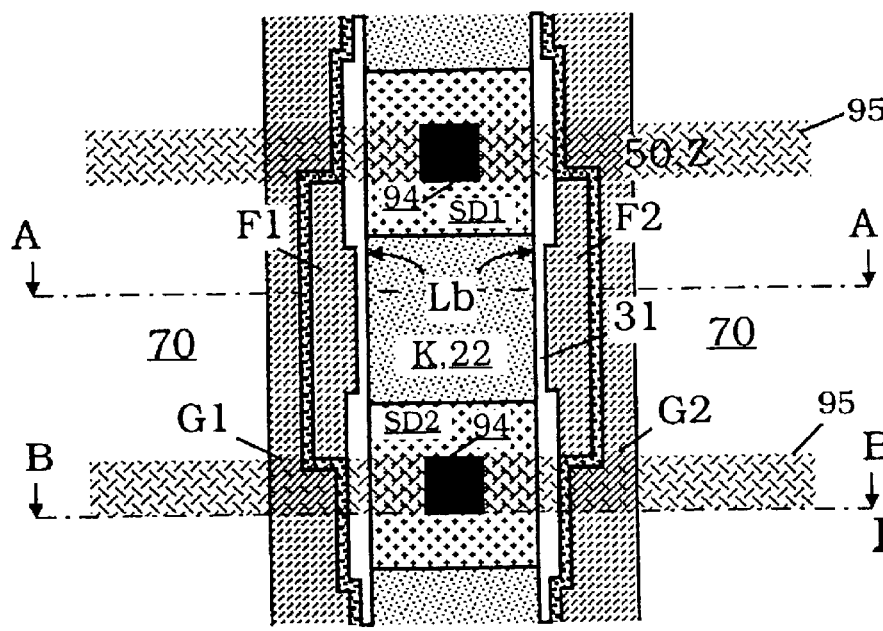
FIG. 15C is a cross-sectional plan view of the third alternative embodiment of the contact connection process according to the invention along the sectional plane C—C of FIGS. 15A and 15B.

FIGS. 14A to 14C thereof firstly illustrate the formation of contact holes with a corresponding metallic filling 94 of the contact holes. A significant overetching of the floating gates F1 and F2 or of the control gates G1 and G2 is not necessary in this case. In the transition to the intermediate state shown in FIGS. 15A to 15C, a metal deposition 95 is, then, once again carried out to form bit lines and source lines. The metal layer can be patterned jointly with the contacts using a dual damascene technique.

I claim:

1. A floating gate memory cell for nonvolatile storage of information including at least one of information units and binary bits, comprising:
   a floating gate configuration for storing the information, said floating gate configuration having floating gates each independently storing the information and, as a result, storing a corresponding plurality of one of the information units and the binary bits independently of one another in the memory cell;
   a source/drain configuration accessing said floating gate configuration;
   a control gate configuration controlling access to said floating gate configuration, said control gate configuration having control gates each associated with a respective one of said floating gates, access to said respective one of said floating gates being controlled by each respective one of said control gates; and
   said source/drain configuration having two source/drain regions jointly provided for said floating gates and said control gates to permit access of all of said floating gates through said two common source/drain regions.

2. The floating gate memory cell according to claim 1, wherein said floating gates:
   have at least one of geometrical properties and material properties; and
   are substantially identical with respect to at least one of said geometrical properties and said material properties.

3. The floating gate memory cell according to claim 1, wherein:
   said floating gates are disposed and configured in a manner substantially electrically insulated from one another, from said control gates, and from said source/drain regions; and
   each of said floating gates is disposed in a substantially capacitively coupled manner.

4. The floating gate memory cell according to claim 1, wherein said control gates:
   have at least one of geometrical properties and material properties; and
   are substantially identical with respect to said geometrical properties and said material properties.

5. The floating gate memory cell according to claim 1, wherein said control gates are disposed and configured in a manner electrically insulated from one another, from said floating gates and from said source/drain regions.

6. The floating gate memory cell according to claim 1, wherein at least one of said floating gates and said control gates are of one of the group consisting of a polysilicon material, a polycide, and a metal.

7. The floating gate memory cell according to claim 1, wherein said floating gates and said control gates are of the same material.

8. The floating gate memory cell according to claim 1, wherein:
   said floating gates and said control gates respectively assigned to one another are in direct spatial proximity to one another; and
   one of an intermediate insulation region and an intermediate dielectric is provided with said floating gates and said control gates respectively assigned to one another.

9. The floating gate memory cell according to claim 1, wherein:
   said floating gates and said control gates respectively assigned to one another are in direct spatial proximity to one another; and
   one of an intermediate insulation region and an intermediate dielectric is disposed between said floating gates and said control gates respectively assigned to one another.

10. The floating gate memory cell according to claim 1,
    each of said floating gates has a first end region and a second end region; and
    a respective first end region is configured and disposed in direct spatial proximity to said first source/drain region and a respective second end region is configured and disposed in direct spatial proximity to the second source/drain region to form, thereby, at least one of a spatial overlap and areal overlap between said floating gates and said first and second drain regions.

11. The floating gate memory cell according to claim 10, including an insulation region disposed between a respective one of said floating gates and said source/drain regions.

12. The floating gate memory cell according to claim 11, wherein said insulation region is of a silicon dioxide material.

13. The floating gate memory cell according to claim 1, wherein:
   each of said floating gates has a first end region and a second end region; and
   a respective first end region is configured and disposed in direct spatial proximity to said first source/drain region and a respective second end region is configured and disposed in direct spatial proximity to the second source/drain region to form, thereby, at least one of a spatial overlap and areal overlap between respective ones of said first and second end regions and said first and second source/drain regions.

14. The floating gate memory cell according to claim 13, including an insulation region disposed between a respective one of said first and second end regions said first and second source/drain regions.

15. The floating gate memory cell according to claim 14, wherein said insulation region is of a silicon dioxide material.

16. The floating gate memory cell according to claim 1, including one of the group consisting of an elevated region, a lamella, a web, and a burr of a semiconductor material region as a main region of the floating gate cell.

17. The floating gate memory cell according to claim 16, wherein:
   one of said main region and said lamella has side regions;
   said floating gates are disposed in a region of said side regions opposite one another with said main region between said floating gates;
   said main region is in direct spatial proximity to said floating gates; and
   said floating gates have a respective insulation region disposed toward said main region.

18. The floating gate memory cell according to claim 17, wherein:
   said main region has channel region; and
   said source/drain regions are one of $n^+$-doped and $p^+$-doped regions of said main region isolated by said channel region.

19. A semiconductor memory device, comprising:
   floating gate memory cells for nonvolatile storage of information including at least one of information units and binary bits, each of said memory cells having:
      a floating gate configuration having floating gates each independently storing the information and, as a result, storing a corresponding plurality of one of the information units and the binary bits independently of one another in each of said memory cells;
      a source/drain configuration accessing said floating gate configuration;
      a control gate configuration controlling access to said floating gate configuration, said control gate configuration having control gates each associated with a respective one of said floating gates, access to said respective one of said floating gates being controlled by each respective one of said control gates; and
      said source/drain configuration having two source/drain regions jointly provided for said floating gates and said control gates to permit access of all of said floating gates through said two common source/drain regions.

20. The semiconductor memory device according to claim 19, wherein at least some of said control gates in adjacent ones of said memory cells are common control gates.

21. The semiconductor memory device according to claim 19, wherein said memory cells are configured and disposed in a matrix and on a plurality of substantially identical main regions.

22. The semiconductor memory device according to claim 21, wherein said main regions are at least one of columns and rows of said matrix of said memory cells.

23. The semiconductor memory device according to claim 19, wherein said main regions are one of the group consisting of lamellae, webs, and burrs.

24. The semiconductor memory device according to claim 23, wherein said main regions extend linearly and equidistantly with respect to one another.

25. The semiconductor memory device according to claim 19, wherein:
   at least some of said control gates in adjacent ones of said memory cells are common control gates;
   said memory cells are configured and disposed in a matrix and on a plurality of substantially identical main regions; and
   said main regions:
      are one of the group consisting of lamellae, webs, and burrs;
      extend linearly and equidistantly with respect to one another; and
      are at least one of columns and rows of said matrix of said memory cells.

26. A floating gate memory cell for nonvolatile storage of information including at least one of information units and binary bits, comprising:
   a floating gate configuration for storing the information, said floating gate configuration having floating gates each independently storing the information and, as a result, storing a corresponding plurality of one of the information units and the binary bits independently of one another in the memory cell;
   a source/drain configuration connected to said floating gate configuration and accessing said floating gate configuration;
   a control gate configuration connected to said floating gate configuration and controlling access to said floating gate configuration, said control gate configuration having control gates each associated with a respective one of said floating gates, access to said respective one of said floating gates being controlled by each respective one of said control gates; and
   said source/drain configuration having two source/drain regions jointly provided for said floating gates and said control gates to permit access of all of said floating gates through said two common source/drain regions.

27. A method for fabricating a floating gate memory cell for nonvolatile information storage, which comprises:
   providing a floating gate configuration for storing information, the floating gate configuration having floating gates each storing the information substantially independently of one another in the memory cell;
   accessing the floating gate configuration with a source/drain configuration;
   controlling the access to the floating gate configuration with a control gate configuration having a plurality of control gates, a respective one of the control gates being associated with a respective one of the floating gates;
   controlling access to the associated one of the floating gates with each respective one of the control gates;
   providing the source/drain configuration with two source/drain regions jointly associated with the floating gates and the control gates; and
   making accessible all of the floating gates through the two common source/drain regions.

28. The method according to claim 27, which comprises configuring the floating gates substantially identical with respect to at least one of geometrical properties and material properties of the floating gates.

29. The method according to claim 27, which comprises:
placing and configuring the floating gates in a manner substantially electrically insulated from one another, from the control gates and from the source/drain regions; and
placing and configuring each floating gate in the memory cell in a substantially capacitively coupled manner.

30. The method according to claim 27, which comprises configuring the control gates substantially identical with respect to at least one of geometrical properties and material properties of the control gates.

31. The method according to claim 27, which comprises placing and configuring the control gates in a manner substantially electrically insulated from one another, from the floating gates, and from the source/drain regions.

32. The method according to claim 27, wherein at least one of the floating gates and the control gates are of a polysilicon material.

33. The method according to claim 27, wherein the floating gates and the control gates are of the same material.

34. The method according to claim 27, which comprises providing the floating gates and the control gates respectively assigned to one another in direct spatial proximity to one another and with an intermediate insulation region in each case.

35. The method according to one of claim 34, wherein the intermediate insulation region is an intermediate dielectric.

36. The method according to claim 27, which further comprises:
configuring each of the floating gates with a first end region and a second end region;
placing and configuring a respective first end region in direct spatial proximity to the first source/drain region and placing and configuring a respective second end region in direct spatial proximity to the second source/drain region to form at least one of a spatial overlap and an areal overlap between the floating gates and the source/drain regions.

37. The method according to claim 36, which further comprises providing an insulation region between the respective floating gate and the source/drain regions.

38. The method according to claim 37, wherein the insulation region is of a silicon dioxide material.

39. The method according to claim 27, which further comprises:
configuring each of the floating gates with a first end region and a second end region;
placing and configuring a respective first end region in direct spatial proximity to the first source/drain region and placing and configuring a respective second end region in direct spatial proximity to the second source/drain region to form at least one of a spatial overlap and an areal overlap between the respective end regions of the floating gates and the respective source/drain regions.

40. The method according to claim 39, which further comprises providing an insulation region between the respective end regions of the floating gates and the source/drain regions.

41. The method according to claim 40, wherein the insulation region is of a silicon dioxide material.

42. The method according to claim 27, which further comprises providing an elevated region of a semiconductor material region as a main region of the floating gate cell.

43. The method according to claim 42, wherein the elevated region is one of the group consisting of a lamella, a web, and a burr.

44. The method according to claim 42, which further comprises:
providing the main region with side regions; and
providing floating gates in a region of the side regions.

45. The method according to claim 44, which further comprises two floating gates in a region of the side regions.

46. The method according to claim 45, which further comprises providing the two floating gates opposite one another with the main region therebetween.

47. The method according to claim 46, which further comprises providing the floating gates in direct spatial proximity to the main region with an insulation region between the floating gates facing toward the main region.

48. The method according to claim 47, wherein the main region is a lamella.

49. The method according to claim 44, which further comprises:
providing the main region with channel region; and
configuring the source/drain regions as one of $n^+$-doped regions and $p^+$-doped regions of the main region, isolated by the channel region.

50. The method according to claim 44, which further comprises:
first providing a semiconductor substrate region;
then forming doping regions locally for the source/drain regions; and
then forming the main region for the memory cell by etching back surroundings in the semiconductor substrate region, in particular, using a masking process and/or in a second strip form transversely with respect to the first strip form.

51. The method according to claim 50, wherein the semiconductor substrate region is one of p-doped silicon and n-doped silicon, and which further comprises:
forming the doping regions by implantation, the doping regions being at least one of:
$n^+$-doped doping regions or $p^+$-doped doping regions; and
disposed in a first strip; and
forming the main region at least one of with a masking process and in a second strip transverse with respect to the first strip.

52. The method according to claim 50, which further comprises subsequently one of forming and depositing substantially conformally an insulating layer.

53. The method according to claim 52, wherein the insulating layer is at least one of:
a silicon dioxide material; and
for the insulation region between the main region and the floating gates.

54. The method according to claim 53, wherein the insulating layer is formed by growing the insulating layer.

55. The method according to claim 54, which further comprises subsequently forming a material region for the floating gates.

56. The method according to claim 55, wherein the material region for the floating gates is formed by deposition.

57. The method according to claim 56, wherein the material region for the floating gates is one of a polysilicon material and metal polycide.

58. The method according to claim 57, which further comprises subsequently patterning the floating gates to have the material region for the floating gates remain only in a region of the side regions of the main region.

59. The method according to claim 58, wherein the patterning step is performed by at least one of:
etching columns into the material region for the floating gates, the columns running substantially perpendicular to an extent of the main region; and one of subsequently removing and etching back the material region for the floating gates to a point below a level of a surface region of the main region.

60. The method according to claim 59, which further comprises subsequently one of forming, depositing, and conformally depositing a material region substantially over an entire area of the memory cell.

61. The method according to claim 60, wherein the material region 50 is for the insulation region between the associated ones of the floating gates and the control gates.

62. The method according to claim 61, which further comprises subsequently one of forming, depositing, and conformally depositing a material region for the control gates substantially over an entire area of the memory cell.

63. The method according to claim 62, which further comprises subsequently patterning the control gates to have the material region for the control gates remain only in a region of the side regions of the main region.

64. The method according to claim 63, which further comprises carrying out the patterning by patterning the control gates to not remove the material region for the intermediate insulation region.

65. The method according to claim 64, wherein the patterning of the control gates is performed by at least one of:
    etching columns in the material region for the control gates, the columns running substantially perpendicularly to an extent of the main region; and
    one of subsequently removing and etching back the material region for the control gates to a point below a level of a surface region of the material region for the intermediate insulation region.

66. The method according to claim 65, which further comprises:
    subsequently embedding a structure obtained in an insulation region; and
    subsequently forming a contact connection to at least one of the source/drain regions and the control gates.

67. The method according to claim 44, which further comprises:
    first providing a semiconductor substrate region;
    then forming the main region for the memory cell by etching back surroundings in the semiconductor substrate region; and
    locally forming doping regions for the source/drain regions.

68. The method according to claims 67, wherein the semiconductor substrate region is p-doped silicon, and which further comprises:
    etching back the surroundings in the semiconductor substrate region at least one of with a masking process and in a first strip; and
    locally forming the doping regions at least one of by implantation and in a second strip transverse with respect to the first strip.

69. The method according to claim 67, which further comprises subsequently one of forming and depositing substantially conformally an insulating layer.

70. The method according to claim 69, wherein the insulating layer is at least one of:
    a silicon dioxide material; and
    for the insulation region between the main region and the floating gates.

71. The method according to claim 70, wherein the insulating layer is formed by growing the insulating layer.

72. The method according to claim 71, which further comprises subsequently forming a material region for the floating gates.

73. The method according to claim 72, wherein the material region for the floating gates is formed by deposition.

74. The method according to claim 73, wherein the material region for the floating gates is one of a polysilicon material and metal polycide.

75. The method according to claim 74, which further comprises subsequently patterning the floating gates to have the material region for the floating gates remain only in a region of the side regions of the main region.

76. The method according to claim 75, wherein the patterning step is performed by at least one of:
    etching columns into the material region for the floating gates, the columns running substantially perpendicular to an extent of the main region; and
    one of subsequently removing and etching back the material region for the floating gates to a point below a level of a surface region of the main region.

77. The method according to claim 76, which further comprises subsequently one of forming, depositing, and conformally depositing a material region substantially over an entire area of the memory cell.

78. The method according to claim 77, wherein the material region 50 is for the insulation region between the associated ones of the floating gates and the control gates.

79. The method according to claim 78, which further comprises subsequently one of forming, depositing, and conformally depositing a material region for the control gates substantially over an entire area of the memory cell.

80. The method according to claim 79, which further comprises subsequently patterning the control gates to have the material region for the control gates remain only in a region of the side regions of the main region.

81. The method according to claim 80, which further comprises carrying out the patterning by patterning the control gates to not remove the material region for the intermediate insulation region.

82. The method according to claim 81, wherein the patterning of the control gates is performed by at least one of:
    etching columns in the material region for the control gates, the columns running substantially perpendicularly to an extent of the main region; and
    one of subsequently removing and etching back the material region for the control gates to a point below a level of a surface region of the material region for the intermediate insulation region.

83. The method according to claim 82, which further comprises:
    subsequently embedding a structure obtained in an insulation region; and
    subsequently forming a contact connection to at least one of the source/drain regions and the control gates.

84. The method according to claim 42, wherein the main region is at least one of linear and approximately parallelepipedal.

85. The method according to claim 27, wherein the information units are binary bits.

* * * * *